United States Patent
Satou et al.

(10) Patent No.: US 9,287,877 B2
(45) Date of Patent: Mar. 15, 2016

(54) RECONFIGURABLE SEMICONDUCTOR DEVICE

(71) Applicant: TAIYO YUDEN CO., LTD., Tokyo (JP)

(72) Inventors: Masayuki Satou, Tokyo (JP); Koshi Sato, Saitama (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/375,761

(22) PCT Filed: Feb. 14, 2013

(86) PCT No.: PCT/JP2013/053452
§ 371 (c)(1),
(2) Date: Jul. 30, 2014

(87) PCT Pub. No.: WO2013/153851
PCT Pub. Date: Oct. 17, 2013

(65) Prior Publication Data
US 2015/0042377 A1    Feb. 12, 2015

(30) Foreign Application Priority Data

Apr. 11, 2012  (JP) ................................. 2012-090623

(51) Int. Cl.
*H03K 19/00* (2006.01)
*H03K 19/177* (2006.01)
(Continued)

(52) U.S. Cl.
CPC ........ *H03K 19/17728* (2013.01); *G06F 11/277* (2013.01); *H03K 19/17732* (2013.01); *H03K 19/003* (2013.01); *H03K 19/1776* (2013.01)

(58) Field of Classification Search
USPC ........ 365/189.11, 189.12, 191, 201, 189.011, 365/189.02, 189.03; 326/16, 40–41
See application file for complete search history.

(56) References Cited

U.S. PATENT DOCUMENTS

| 5,196,740 A | 3/1993 | Austin |
| 5,677,691 A | 10/1997 | Hosticka et al. |

(Continued)

FOREIGN PATENT DOCUMENTS

| JP | 5-175466 A | 7/1993 |
| JP | 8-507188 A | 7/1996 |

(Continued)

OTHER PUBLICATIONS

Written Opinion (PCT/ISA/237) issued in PCT/JP2013/053452 mailed in Apr. 2013.

(Continued)

*Primary Examiner* — Minh D A
(74) *Attorney, Agent, or Firm* — Chen Yoshimura LLP

(57) ABSTRACT

A semiconductor device capable of reconfiguration, including: a plurality of logic units which configure an array and are connected to each other, wherein each logic unit includes a pair of a first and a second memory cell units, each of the first and the second memory cell units operates as a logic element when truth value table data is written in, which is configured so that a logic calculation of an input value specified by a plurality of addresses is output to a data line, and/or operates as a connection element when truth value table data is written in, which is configured so that an input value specified by a certain address is output to a data line to be connected to an address of another memory cell unit, a latter stage of the first memory cell unit includes a sequential circuit which synchronizes with a clock, and the logic units include, for each pair of the first and the second memory cell units, a selection unit which selectively outputs an address to the first or the second memory cell unit in accordance with an operation switch signal.

8 Claims, 27 Drawing Sheets

(51) Int. Cl.
  *G06F 11/277* (2006.01)
  *H03K 19/003* (2006.01)

(56) References Cited

U.S. PATENT DOCUMENTS

| | | | |
|---|---|---|---|
| 2002/0038439 | A1 | 3/2002 | Sato |
| 2003/0229877 | A1 | 12/2003 | Bersch et al. |
| 2005/0237083 | A1 | 10/2005 | Bakker et al. |
| 2011/0291019 | A1* | 12/2011 | Yuan et al. ............... 250/370.09 |
| 2012/0081977 | A1* | 4/2012 | Widjaja et al. ......... 365/189.011 |

FOREIGN PATENT DOCUMENTS

| | | |
|---|---|---|
| JP | 2002-123562 A | 4/2002 |
| JP | 2004-110771 A | 4/2004 |
| JP | 2006-3239 A | 1/2006 |
| JP | 2007-502014 A | 2/2007 |
| JP | 2012-4582 A | 1/2012 |

OTHER PUBLICATIONS

Miyazaki et al., "Development of Embedded Organic Module Technology", Journal of Japan Institute of Electronics Packaging, vol. 10, No. 4, Jul. 1, 2007, pp. 298 to 304, Japan Institute of Electronics Packaging.

International Search Report (ISR) issued in PCT/JP2013/053452 mailed in Apr. 2013.

\* cited by examiner

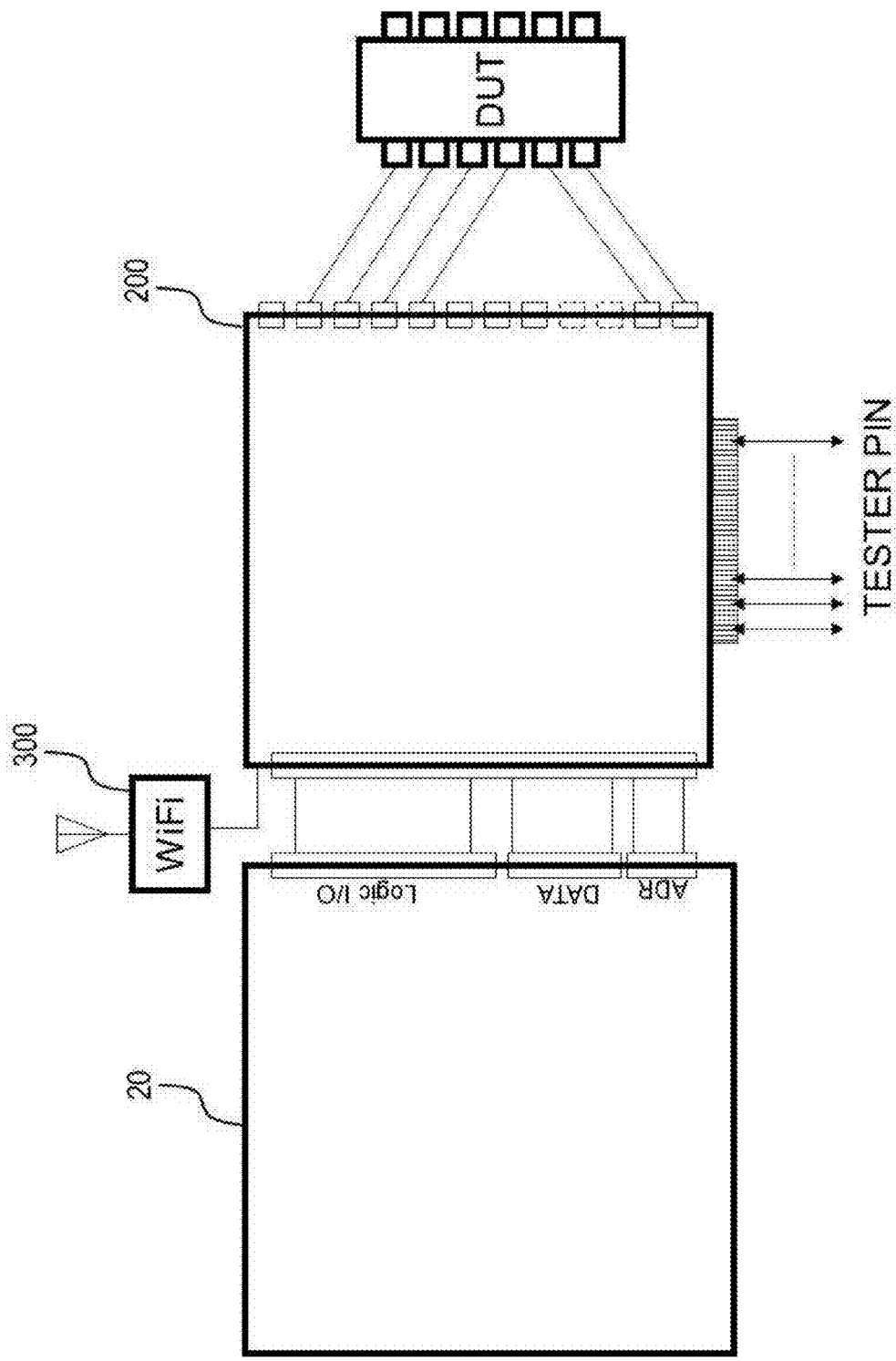

FIG.9B

FUNCTION DESCRIPTION (Spectre-HDL)

```
module rc behav(in,out,ref) (R,C)
node [V,I] in,out,ref;
parameter real R=1, C=1;
{
  node [V,I] n1;
  analog{
        I(n1,in) <- V(in,n1)/R;
        V(n1,ref) <-         integ(I(n1,in),0)/C;
        V(out,ref) <- V(n1,ref);
        }
}
```

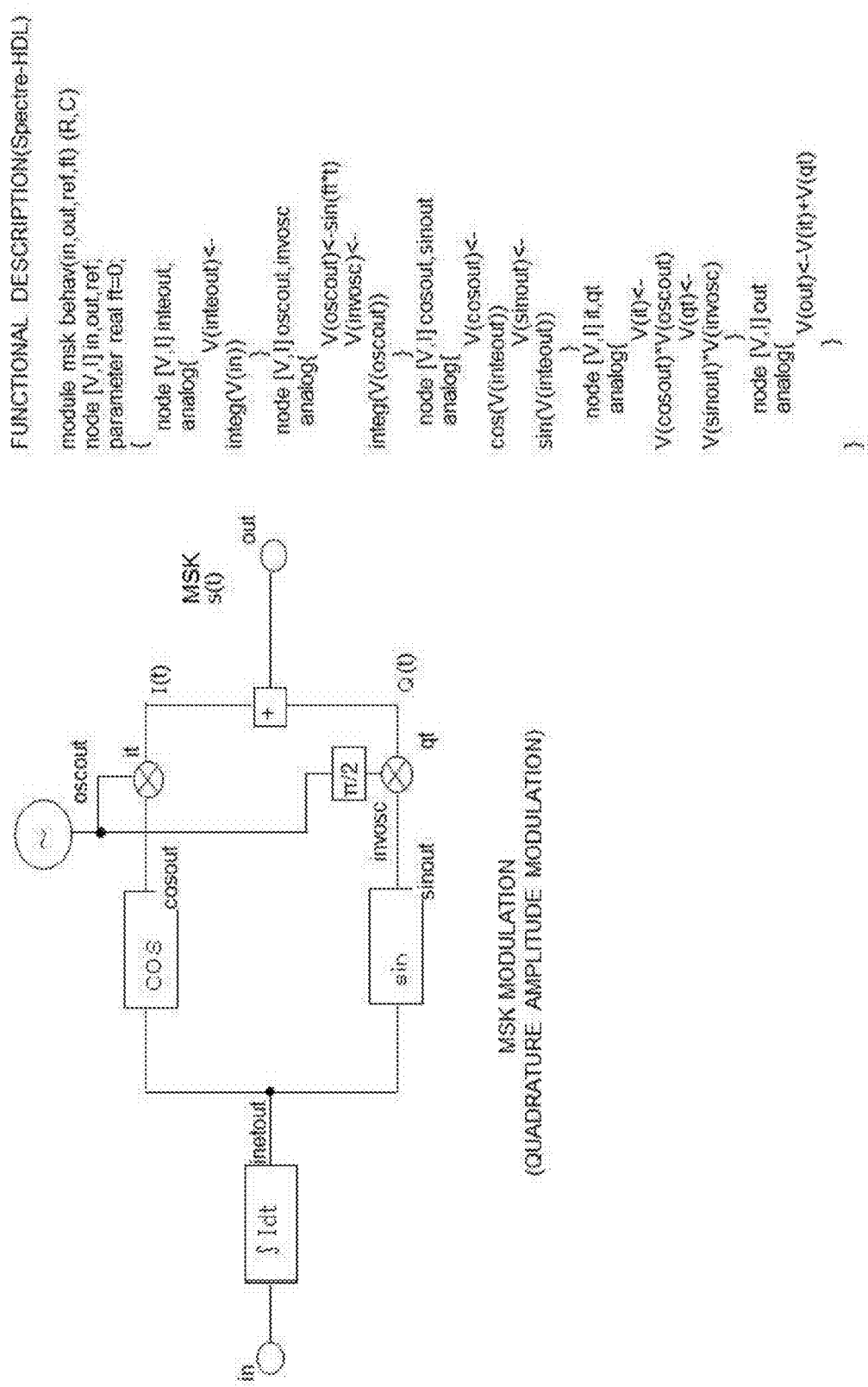

FIG.13

| A0 | A1 | A2 | A3 | D0 | D1 | D2 | D3 |
|----|----|----|----|----|----|----|----|
| 0 | 0 | 0 | 0 | 0 | * | * | * |
| 1 | 0 | 0 | 0 | 1 | * | * | * |
| 0 | 1 | 0 | 0 | 1 | * | * | * |
| 1 | 1 | 0 | 0 | 1 | * | * | * |
| 0 | 0 | 1 | 0 | 0 | * | * | * |
| 1 | 0 | 1 | 0 | 1 | * | * | * |
| 0 | 1 | 1 | 0 | 1 | * | * | * |
| 1 | 1 | 1 | 0 | 1 | * | * | * |
| 0 | 0 | 0 | 1 | 0 | * | * | * |
| 1 | 0 | 0 | 1 | 1 | * | * | * |
| 0 | 1 | 0 | 1 | 1 | * | * | * |
| 1 | 1 | 0 | 1 | 1 | * | * | * |
| 0 | 0 | 1 | 1 | 1 | * | * | * |
| 1 | 0 | 1 | 1 | 1 | * | * | * |
| 0 | 1 | 1 | 1 | 1 | * | * | * |
| 1 | 1 | 1 | 1 | 1 | * | * | * |

FIG.15

| A0 | A1 | A2 | A3 | D0 | D1 | D2 | D3 |
|----|----|----|----|----|----|----|----|
| 0  | 0  | 0  | 0  | 0  | 0  | 0  | 0  |
| 1  | 0  | 0  | 0  | 0  | 1  | 0  | 0  |
| 0  | 1  | 0  | 0  | 0  | 0  | 1  | 0  |
| 1  | 1  | 0  | 0  | 0  | 1  | 1  | 0  |
| 0  | 0  | 1  | 0  | 0  | 0  | 0  | 1  |
| 1  | 0  | 1  | 0  | 0  | 1  | 0  | 1  |
| 0  | 1  | 1  | 0  | 0  | 0  | 1  | 1  |
| 1  | 1  | 1  | 0  | 0  | 1  | 1  | 1  |
| 0  | 0  | 0  | 1  | 1  | 0  | 0  | 0  |
| 1  | 0  | 0  | 1  | 1  | 1  | 0  | 0  |
| 0  | 1  | 0  | 1  | 1  | 0  | 1  | 0  |
| 1  | 1  | 0  | 1  | 1  | 1  | 1  | 0  |
| 0  | 0  | 1  | 1  | 1  | 0  | 0  | 1  |
| 1  | 0  | 1  | 1  | 1  | 1  | 0  | 1  |
| 0  | 1  | 1  | 1  | 1  | 0  | 1  | 1  |
| 1  | 1  | 1  | 1  | 1  | 1  | 1  | 1  |

FIG.18

| A0 | A1 | A2 | A3 | D0 | D1 | D2 | D3 |
|----|----|----|----|----|----|----|----|
| 0 | 0 | 0 | 0 | 0 | * | 0 | * |
| 1 | 0 | 0 | 0 | 0 | * | 0 | * |
| 0 | 1 | 0 | 0 | 0 | * | 0 | * |
| 1 | 1 | 0 | 0 | 1 | * | 0 | * |
| 0 | 0 | 1 | 0 | 0 | * | 0 | * |
| 1 | 0 | 1 | 0 | 0 | * | 0 | * |
| 0 | 1 | 1 | 0 | 0 | * | 0 | * |
| 1 | 1 | 1 | 0 | 0 | * | 0 | * |
| 0 | 0 | 0 | 1 | 0 | * | 1 | * |
| 1 | 0 | 0 | 1 | 0 | * | 1 | * |
| 0 | 1 | 0 | 1 | 0 | * | 1 | * |
| 1 | 1 | 0 | 1 | 1 | * | 1 | * |
| 0 | 0 | 1 | 1 | 0 | * | 1 | * |
| 1 | 0 | 1 | 1 | 0 | * | 1 | * |
| 0 | 1 | 1 | 1 | 0 | * | 1 | * |
| 1 | 1 | 1 | 1 | 0 | * | 1 | * |

RECONFIGURABLE SEMICONDUCTOR DEVICE

CROSS-REFERENCE TO RELATED APPLICATION

This application is a 371 application of an international PCT application serial no. PCT/JP2013/053452, filed on Feb. 14, 2013, which claims the priority benefit of the Japanese Patent Application No. 2012-090623, filed on Apr. 11, 2012, the entire contents of which are incorporated herein by reference.

TECHNICAL FIELD

The present invention relates to a semiconductor device capable of reconfiguration.

BACKGROUND ART

In recent years, by the miniaturization of a semiconductor manufacturing process and higher integration thereof, an SoC (System-on-a-Chip) in which the almost entire systems are integrated on one LSI (Large Scale Integration) has been generalized. When compared with the case in which a plurality of single-function LSIs are implemented on a board, the SoC brings about various advantages such as reduction of occupation area on the print board, speeding up, reduction of electric power consumption, and reduction of cost.

Since the SoC realizes an analog circuit on a chip, the SoC has a problem different from that of a simple LSI. For example, when a plurality of independent power source area are provided inside one chip, and each of the electric power source is independently controlled to be blocked, there is a problem for the signal wiring in the chip. Accordingly, a semiconductor device is provided, configured by including, as a unit to observe the voltage changes inside the LSI, a voltage monitor which converts voltage changes into frequency changes by a ring oscillator configured by a MISFET (Metal-Insulator-Semiconductor Field-Effect Transistor) of a first gate insulation film thickness, similar to a MISFET configuring the logic circuit; and an amplification circuit which outputs the output signal to outside of the LSI, and the voltage monitor is configured by a MISFET having small threshold value so as to operate even when the electric power source voltage has a lower value (Patent Literature 1).

PRIOR ART DOCUMENT(S)

Patent Literature(s)

Patent literature 1: Japanese Patent Application Laid-open Publication No. 2012-004582

SUMMARY OF THE INVENTION

Problems to be Solved by the Invention

In the past, analog circuit units were integrated into the chip, as represented be SoC. However, since the analog circuit consists of unique circuit configuration that is configured to be operated in each chip, the circuit design is required to each chip development. Further, although it is disclosed that the area of SoC is divided with respect to a plurality of electrical power supplies, and each area is separately power offed according to corresponding electrical power supply, the analog circuit itself is not configurable. The applicant enables the analog circuit itself to be configurable, whereby developed a configurable semiconductor device capable of reconfiguration of analog circuits.

The semiconductor device according to one embodiment of the present invention has an object of reconfiguring the semiconductor device, by disposing a plurality of electric circuit units in an array.

Means to Solve the Problems

Embodiments to solve the above mentioned problems are shown in the following items.

1. A semiconductor device capable of reconfiguration, including a plurality of electric circuit units disposed in an array, each of the electric circuit units including an analog digital converter, a digital analog converter, and an operational amplifier, wherein a plurality of functional blocks obtained by dividing an analog circuit of a reconfiguration object are subjected to circuit configuration by the analog digital converter, the digital analog converter and the operational amplifier of the electric circuit units, and wherein any one of the plurality of electric circuit units subjected to the circuit configuration is connected to each other by an analog switch, so that the analog circuit of the reconfiguration object is configured.

2. The semiconductor device according to item 1, wherein the plurality of electric circuit units are connected to each other via a wiring plate disposed in a lower portion.

3. The semiconductor device according to item 1 or 2, further including a memory.

4. The semiconductor device according to item 3, wherein the memory stores a circuit description of the analog circuit of the reconfiguration object, and wherein each of the electric circuit units reads out the circuit description at a time of activation, and operates so as to reconfigure a circuit in each of the electric circuit units by the analog switch.

5. The semiconductor device according to any one of items 1 to 4, which configures the analog circuit of the reconfiguration object and electrically verifies a function of the analog circuit of the reconfiguration object. Thus, the semiconductor device functions as an emulation device. The memory may store data to perform pass/fail judgment of the verification results.

6. The semiconductor device according to any one of items 1 to 5, further including a logic unit, the logic unit including a plurality of memory cell units which configure an array and are connected to each other, and the memory cell units operate as a logic element when truth value table data is written in, which is configured so that a logic calculation of an input value specified by a plurality of addresses is output to a data line, and/or operate as a connection element when truth value table data is written in, which is configured so that an input value specified by a certain address is output to a data line to be connected to an address of another memory cell unit; and for each memory cell unit, an address decoder which decodes an address input from N (N being an integer of 2 or more) number of address lines, and outputs a word selection signal to a word line;

wherein each memory cell unit is connected to the word line and the data line, stores data configuring the truth value table, and has a plurality of storage elements which input and output the data to the data line by the word selection signal input from the word line, and wherein the respective N number of address lines of the memory cell units are connected to the data line of the other N number of memory cell units.

7. The semiconductor device according to item 6, wherein the logic unit stores an expected value of an output of a test device in the memory cell units, and wherein the logic unit is capable of configuring a logic circuit identical to a logic circuit of the test device, and operates as the logic element, whereby judges whether the expected value is consistent with the output of the test device.

8. The semiconductor device according to item 5 or 6, wherein each logic unit includes a pair of a first and a second memory cell units, each of the first and the second memory cell units operating as a logic element when truth value table data is written in, which is configured so that a logic calculation of an input value specified by a plurality of addresses is output to a data line, and/or operates as a connection element when truth value table data is written in, which is configured so that an input value specified by a certain address is output to a data line to be connected to an address of another memory cell unit, wherein a latter stage of the first memory cell unit includes a sequential circuit which synchronizes with a clock, and wherein the logic unit includes, for each pair of the first and the second memory cell units, a selection unit which selectively outputs an address to the first or the second memory cell unit in accordance with an operation switch signal.

9. The semiconductor device according to item 8, further including an analog circuit unit having an electric circuit in accordance with the test device, and wherein the second memory cell unit is capable of reconfiguring a logic circuit identical to a logic circuit of the test device in accordance with the truth value table data defining the logic circuit of the test device, and judges whether an expected value of an output of the test device stored in the first memory cell unit is consistent with an output of the test device.

Effect of the Invention

The semiconductor device according to one embodiment of the present invention is capable of reconfiguration by using a memory cell unit having the best area efficiency among integrated circuits, and the configuring elements are made by general-purpose units. Further, the semiconductor device is capable of being manufactured through a standard manufacturing process, and can use a memory IP. Accordingly, such semiconductor device can provide a synchronous/asynchronous memory cell unit by low cost.

The above mentioned semiconductor device makes the usage thereof as a tester easier depending on the usage method, and the application will no longer be limited to tests after DUT (Device Under Test) completion. Accordingly, by using the tester at the design stage, usage such as improving the circuit efficiency of IC may be possible.

BRIEF DESCRIPTION OF THE DRAWINGS

FIG. 5 is a functional block diagram showing a second embodiment of a semiconductor test device;

FIG. 9B is a diagram showing an example of an analog function description of the RC circuit;

FIG. 10B is a diagram showing an example of the analog function description of the circuit block of MSK model communication system of GSM (Registered trademark) specification;

FIG. 13 is a diagram showing a truth value table of the logic circuit shown in FIG. 12;

FIG. 15 is a diagram showing a truth value table of the connection element shown in FIG. 14;

FIG. 18 is a diagram showing a truth value table of the logic element and the connection element shown in FIG. 17.

MODES FOR CARRYING OUT THE INVENTION

Figure 1:
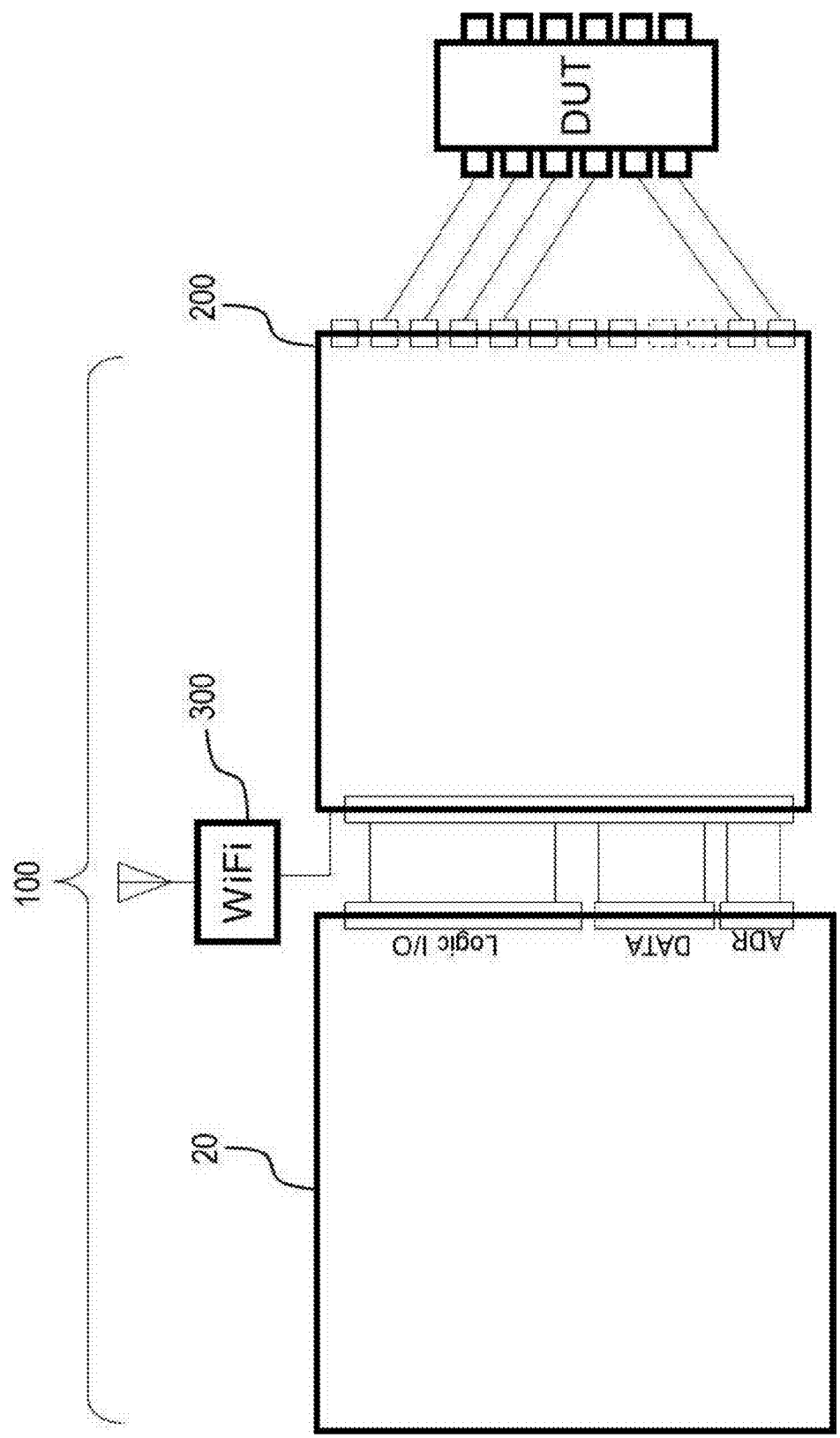
FIG. 1 is a functional block diagram showing a first embodiment of a semiconductor test device.

An LSI (Large Scale Integration) system in which a digital circuit and an analog circuit are integrated on one semiconductor chip requires a test so as to judge whether the product is good or bad by generating an input signal and comparing an output signal to an expected value, based on a test pattern produced at the time of designing an examination object (DUT: Device Under Test), after the semiconductor manufacturing process. There is a semiconductor test device for which such test is performed (hereinbelow referred to as a "tester"). The tester inputs a packaged DUT from outside, reads out an output signal from an IC, and judges whether the DUT operates normally or not. The tester consists mainly of two parts, that is, operation validation of the analog circuit and a function test. The operation validation of the analog circuit is performed by inputting the DUT and detecting the signal thereof, whereby a connection test at the device pin, and measurements of electric power consumption, input leak current, and output voltage are respectively performed. On the other hand, in the function test, the tester performs the same operation as the logic operation of the DUT and outputs a signal. A "logic tester" is used for the logic device, and a "memory tester" is used for the memory device.

A logic tester applies a test pattern to the input terminal of the DUT at a suitable timing, and judges whether the product is good or bad by watching the signal output from the DUT being consistent or inconsistent with the expected value, by using a comparator or a pattern comparator. As ICs are super highly integrated, the test pattern is lengthened, and in order to correctly detect deficiencies of DUT, a so-called logic depth is required with an exceptional deepness. Further, the logic tester has an expected vale for each test pattern, and requires a memory.

A memory tester performs tests of whether the entire cells of DUT can be correctly selected, information can be written in under the conditions defined at the selected cells, and the written-in information can be read out by a defined access time. Accordingly, the test pattern required in the memory tester is more functional and simpler than that in the logic tester, whereby a large memory capacity to store expected values are not required. Thus, the memory tester does not require memory so much.

Testers have numerous pieces of tester hardware required in the tests to make the tests convenient. As the device is being equipped with higher function and speed, the tester hardware also is given higher function, speed, more complication and bigger size. A tester is extremely expensive (for example, more than one hundred million yen per one tester). Accordingly, the test cost is increased, and reducing such cost is an issue. Further, debug of the test programs on the tester is difficult, whereby the cost thereof is also expensive.

In order to solve these problems, virtual tester technique has been developed. The virtual tester technique is a technique in which a tester is expressed on a computer, and design data of the device on the computer and the test programs are both debugged, whereby the test is executed. In order to construct the virtual tester, there is a method of expressing the logic structure and the circuit description of the tester as they are on the computer. However, since the logic structure and the circuit description are large in scale, such method could not exhibit realistic effects. However, as a Higher Level description language (Verilog, VHDL) is developed, the tester can be constructed easier on computers and is in practical use.

Among several thousands to several tens of thousands of tests, each test is configured by several tens of steps, and in a high degree description language, only the tester function (tester resource) required in one test is described. The tester function to be realized by the high degree description language may be sequentially be constructed in a device which is capable of reconfiguration, for example, an FPGA (Field-Programmable Gate Array), to configured the test, whereby the test can be executed by a small-scale test board having the FPGA on the board and the device required for the tester. Such configuration is called a TOB (Tester On Board), and is already realized (Japanese Patent Application Laid-open Publication No. 2002-123562). A test device using the FPGA costs less than the conventional expensive tester device (for example, approximately ten million yen per one tester).

Here, when paying attention to the tester language, the tester language is basically control instructions of a control device, and is defined for each tester maker. However, user-friendliness is given in consideration of the convenience for the tester user (testing engineer). For example, in order to consider the timing accuracy, the tester device should control calibration operation, and the like. However, since such control is not directly relevant to the tester user, the tester device is defined in the form of including such control. Accordingly, there is no common tester language among the testers, and test programs are individually produced on the tester. In order to solve this problem, a technique is proposed in which a tester language which is frequently used is made de facto standard to be used in each tester (Japanese Patent Application Laid-open Publication No. 2006-3239).

In the current test method, a test device is expensive, and in order to reduce the test time, the test is performed by using a device to be a DUT on a tester after completion of the device. When there is a defect in the test after completion of the device, we need to consider whether such defect derives from the problem in the test program, the problem in the device, or a problem in the design. When the defect derives from the design problem, the designing has to be done again, and the discovery of the test defects makes the device completion delayed. The cost problems not only includes the problem in that the tester unit to perform a "function test" is expensive, but also the problem in that the analog circuit included in the tester to perform operation verification of the DUT analog circuit is expensive. This is because, in order to handle the spin electronics of a larger scale and more complicated device, various functions are required in a tester, and an analog circuit for a test having various control width and plurality of functions is inevitably needed.

The semiconductor device capable of reconfiguration developed by the applicant disposes a plurality of electric circuit units in an array to be reconfigured, so as to configure an analog circuit, whereby the semiconductor device can be applied in the entire technical field to which SoC or system LSI is applied. On the other hand, the semiconductor device can also be applicable to make the tester cheaper. The embodiments shown below mainly describe examples of applying the same to a tester, so as to describe the semiconductor device according to the present embodiment.

Hereinbelow, (1) a semiconductor device which is capable of reconfiguration, and a semiconductor test device, (2) a tester debug method at design stage, (3) an analog circuit unit as the semiconductor device which is capable of reconfiguration, and (4) MPLD, are described in this order with reference to the drawings.

(1) Semiconductor Device which is Capable of Reconfiguration, and Semiconductor Test Device FIG. 1 is a functional block diagram showing a first embodiment of a semiconductor test device. The semiconductor test device 100 includes a device capable of reconfiguration of a memory cell unit base, and an analog circuit unit 200. In the present embodiment, an MPLD (Memory-based Programmable Logic Device) 20 developed by the applicant is used as the device capable of reconfiguration of the memory cell unit base. The MPLD is configured by a plurality of memory cell units, whereby costs of ⅕, and a half of chip area, and −30% of electric power consumption can be expected, compared to FPGA. Further, since the MPLD module is a memory and can also serve as a logic, the MPLD module can basically express both the logic tester and the memory tester, and thus can improve mounting efficiency.

Figure 2:
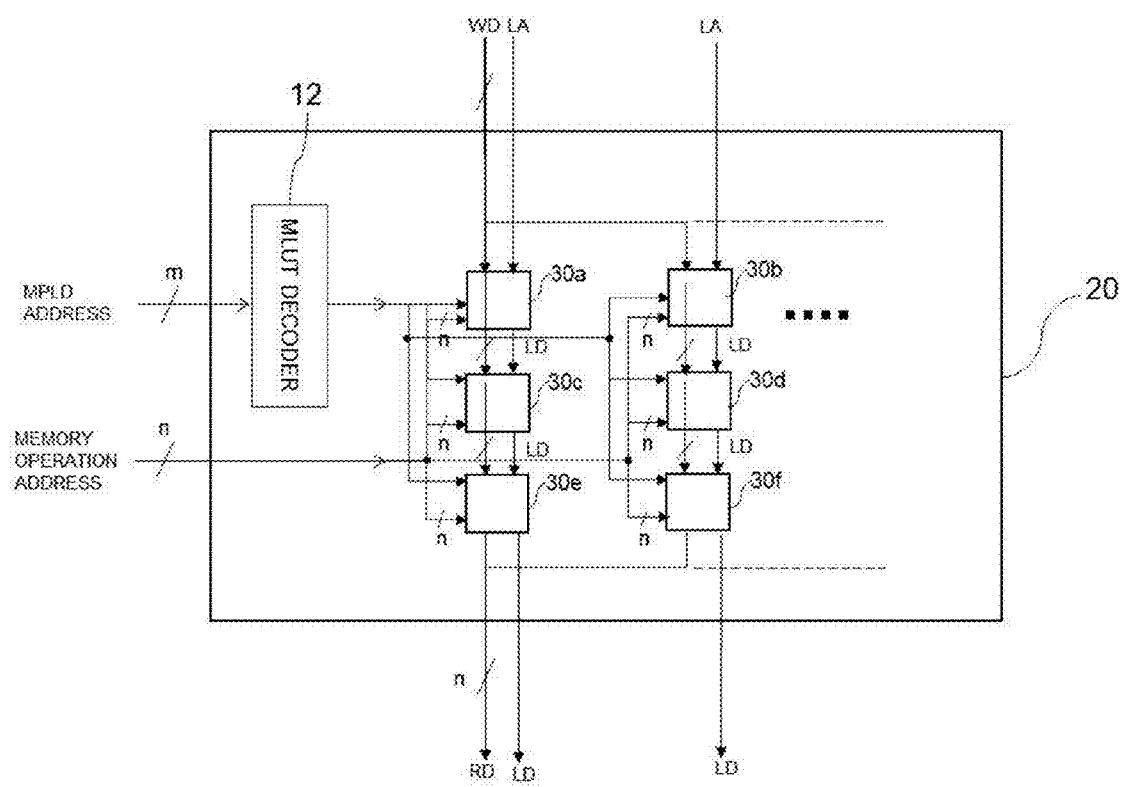
FIG. 2 is one example of a device capable of reconfiguration.

FIG. 2 is one example of a semiconductor device capable of reconfiguration. The MPLD 20 as the semiconductor device capable of reconfiguration mutually connects logic elements (to be described later) which are referred to as an MLUT (Multiple Look-Up Table) and realize both the wiring element and the logic element with each other to configure logic. The MPLD 20 has a configuration as shown in FIG. 2, in which MLUTs are paved in arrays, and MLUTs are mutually connected to each other by using address lines LA and data lines LD. The MPLD 20 includes a plurality of MLUTs 30 configured by memory cell units as well as an MLUT decoder 12 which decodes an address to specify the MLUTs (Multiple Look-Up Tables) and specifies the MLUT which is to be the operation object. Each of the storage element of the MLUT 30 stores each piece of data configuring the truth value tables respectively, whereby the MPLD 20 performs the logic operation operating as a logic element, or a connection element, or both the logic element and the connection element (to be described in (4) MPLD).

Further, the MPLD 20 performs a memory operation. The memory operation is referred to as a write-in WD or read-out RD of data to and from the memory cell unit included in the MLUT 30. The write-in of data to the MLUT 30 also rewrites truth value table data, whereby the memory operation generates reconfiguration of truth value table data.

Figure 3A:
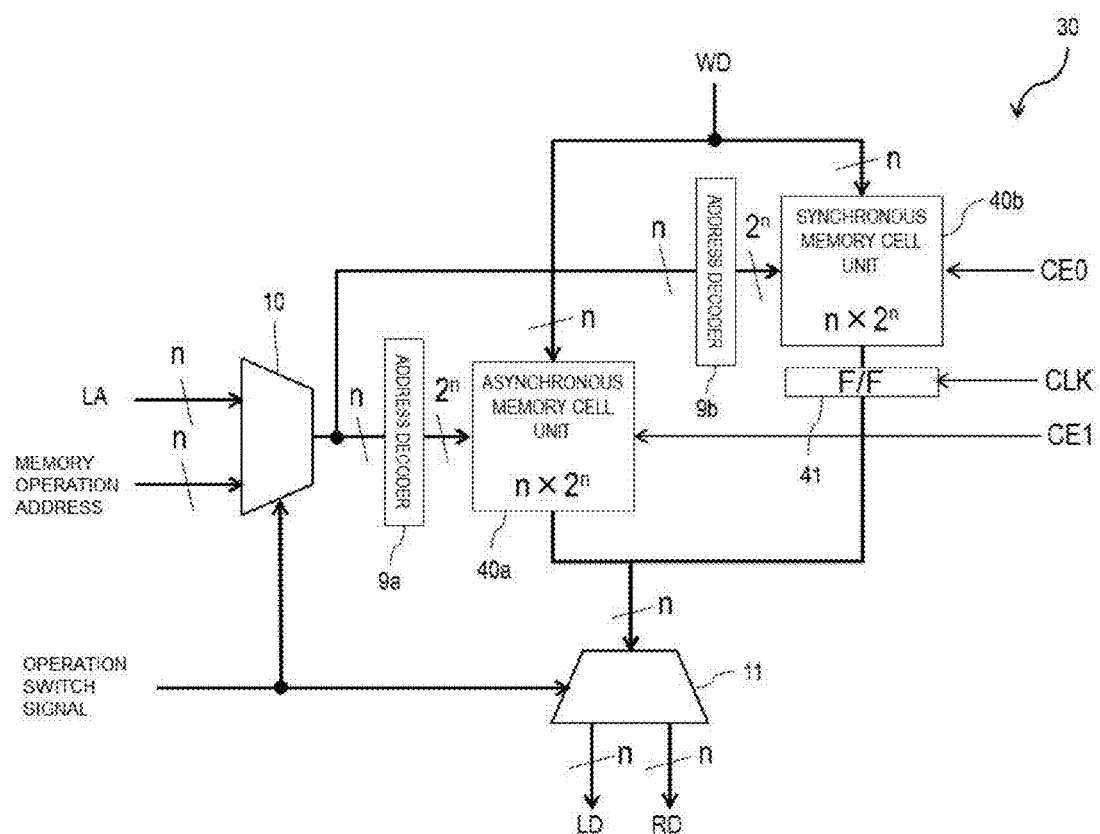
FIG. 3A is one example of a memory cell unit of the device capable of reconfiguration.

FIG. 3A is one example of a memory cell unit of the device capable of reconfiguration. The memory cell unit is configured by a pair of an asynchronous memory cell unit 40a and a synchronous memory cell unit 40b, and further includes an F/F 41 which synchronizes with a clock CLK in the latter stage of the synchronous memory cell unit 40b. Address decoders 9a and 9b are provided in the asynchronous memory cell unit 40a and the synchronous memory cell unit 40b, respectively. The memory cell unit further includes an address switch circuit 10 which selects the memory operation or the logic operation by an operation switch signal; and an output data switch circuit 11 which selects the read-out data RD or the logic operation data LD by the operation switch signal.

A circuit unit consisting of a memory cell unit configuring the MPLD 20 and the surrounding circuits is referred to as an MLUT. By the memory cell unit storing data configuring the truth value table, the MLUT operates as the configuring element of MPLD which is a device capable of reconfiguration. The technical grounds for which the MPLD is used as the device capable of reconfiguration are to be described later.

The MLUT does not always require two memory cell units as described above, although since each MLUT can be used as either synchronous or asynchronous, the MLUT can be used in various ways such as the synchronous memory, the logic element of the sequential circuit, the asynchronous memory, and the logic element of a combination logic circuit. Further, the MPLD is advantageous in the chip area and the cost compared to FPGA, whereby the cost merits can still be exhibited even when the memory cell units are used in such ways. Still further, the logic tester requires capacity memories for the test patterns, and it is advantageous for the tester to have two memory cell units. In the memory tester, the logic description is a basic logic operation and there is not much logic expression (logic mounting scale), and thus the logic mounting scale being reduced in this design will not be a problem.

The MLUT 30 shown in FIG. 3A outputs the logic operation data LD according to the logic operation address LA when the operation switch signal indicates the logic operation. Further, the MLUT 30 receives the write-in data WD or outputs the read-out data RD according to the memory operation address when the operation switch signal indicates the memory operation.

The address switch circuit 10 connects n number of memory operation address signal lines into which memory operation addresses as input, n number of logic operation address input signal lines into which logic operation address signals are input, and operation switch signal lines into which operation switch signals are input. The address switch circuit 10a operates so as to output either one of the memory operation address and the logic operation address to n number of selected address signal lines based on the operation switch signal. The reason why the address switch circuit 10a selects the address signal lines is that the storage element 40 is a one-port type storage element which receives either one of the read-out operation and the write-in operation. In the logic operation, the CE (Chip Enable) 0 and CE 1 are simultaneously made active, whereby the logic sum of the synchronous memory output and the asynchronous memory output is output. Accordingly, the combination circuit and the sequential circuit can be expressed. In the memory operation, the CE 0 and CE 1 are mutually active, whereby certain storing operations are performed.

For example, the AD pairs which make the wiring and the combination circuit be performed store the truth value 0 in the synchronous memory and store a certain truth value in the asynchronous memory, and makes the data of asynchronous memory perform signal transmission. Accordingly, the logic circuit can be configured without clock delay in the memory. Further, the sequential circuit stores a certain truth value in the synchronous memory and sets the truth value 0 for the asynchronous memory. Accordingly, the sequential circuit of clock operation can be configured. Thus, a special F/F is no longer required in the sequential circuit configuration, which makes the configuration efficient.

The address decoders 9a, 9b respectively decode selected address signals received from the n number of address signal lines supplied from the address switch circuit 10, and outputs the decode signal to 2n number of word lines.

The n×2n number of storage elements of the memory cell unit are disposed at the connected portions of the 2n number of word lines, n number of write-in data lines, and n number of output data lines.

When the output data switch circuit 11 receives a signal from the n number of output data lines, the output data switch circuit 11 operates so as to output the read-out data to the n number of read-out data signal lines or to the logic operation signal lines according to the input operation switch signal.

Figure 3B:
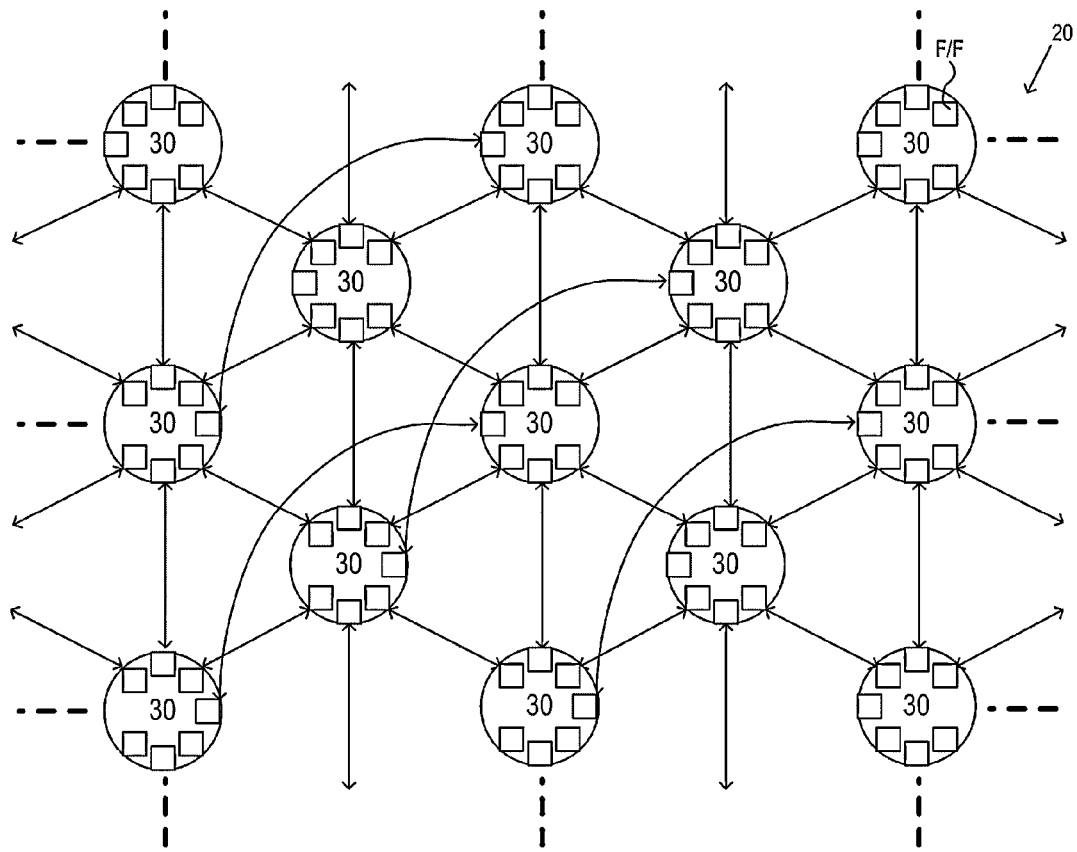
FIG. 3B is one example of connection between memory cell units.

FIG. 3B is a diagram showing one example of a connection between memory cell units. An address line of MLUT 30 is connected to a data line of another MLUT adjacent thereto. In the MLUT 30, a memory is used in which the width of the address line and the width of the data line are the same. Further, one bits of the address line and the data line respectively are made into pairs, to define a pseudo bidirectional line. Such bidirectional line is referred to as an "AD pair" in the MPLD. When a memory is used in which the width of the address line and the width of the data line are N bits, an MLUT 30 having N pairs of AD pairs is realized. FIG. 3A shows an example in which adjacent MLUTs and six AD pairs are connected, and one AD pair is connected to an MLUT disposed distantly. Note that in the present embodiment, a flip-flop is prepared for the output of the MLUT and the output can be performed in synchronization with the clock so that the MLUT can be used as the sequential circuit. Such use of the flip-flop can be switched as described later. When the MLUT is used as the combination logic circuit, the output can be performed without the flip-flop.

(2) Tester Debug Method at Design Stage

Figure 4A:
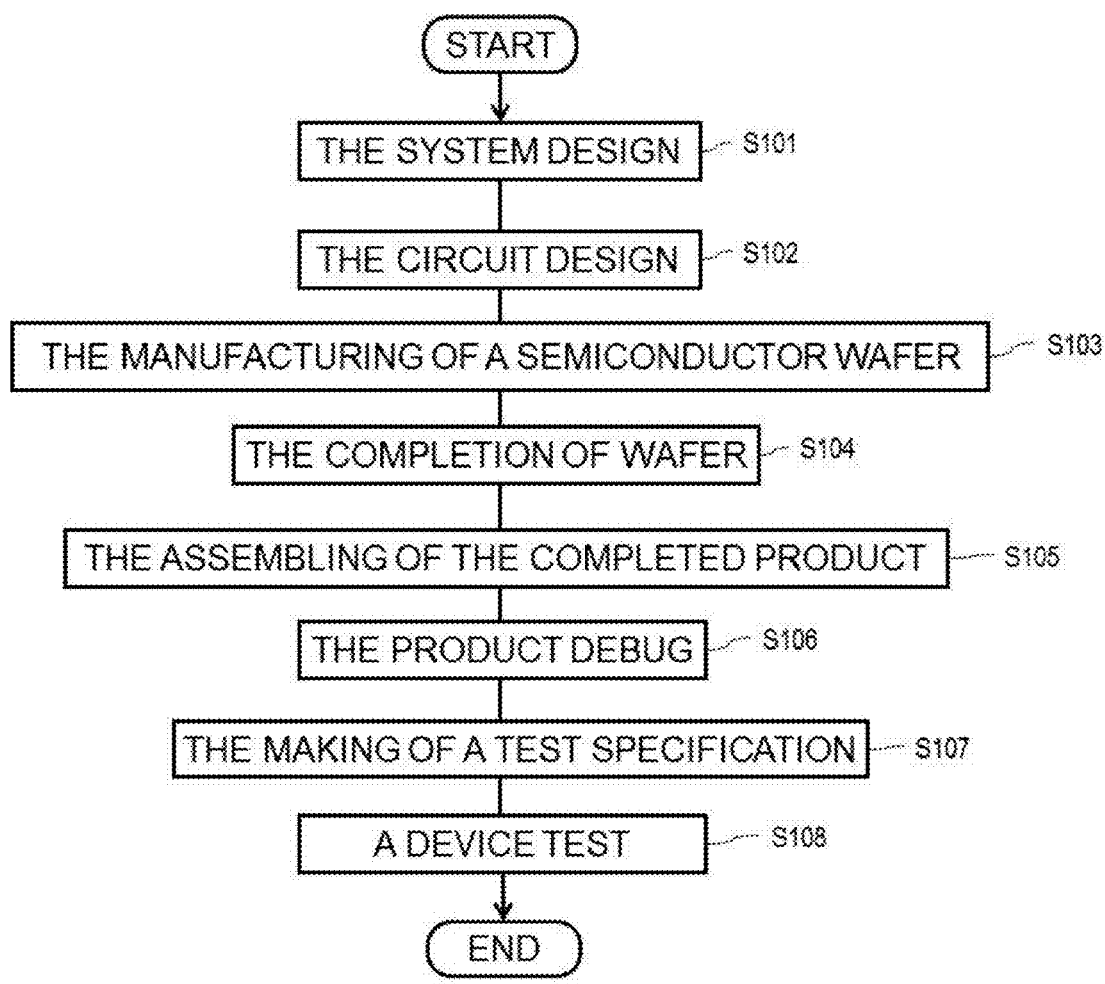
FIG. 4A is a diagram showing a test flowchart of a conventional semiconductor test device.

FIG. 4A is a diagram showing a test flowchart of a conventional semiconductor test device. Conventionally, subsequent to the system design (S101), the circuit design (S102), the manufacturing of a semiconductor wafer (S103), the completion of wafer (S104), the assembling of the completed product (S105), the product debug (S105), and the making of a test specification (S106), a device test is performed by a tester (S108).

Figure 4B:
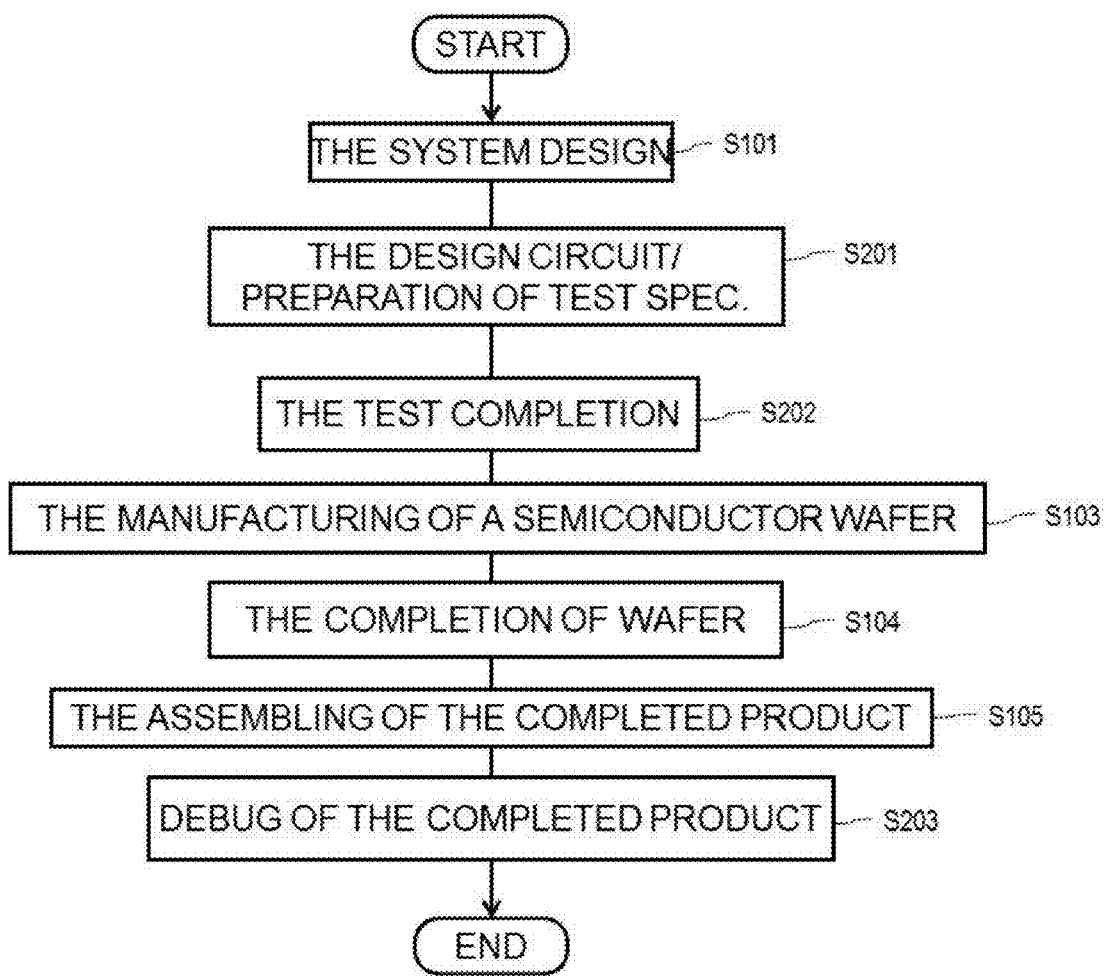
FIG. 4B is a diagram showing a test flowchart of the semiconductor test device according to the present embodiment.

FIG. 4B is a diagram showing a test flowchart of the semiconductor test device according to the present embodiment. In the test flowchart shown in FIG. 4B, the test specification is made at the same time as the circuit design in S201, whereby the same can be tested simultaneously by the semiconductor test device 100. Accordingly, the test can be completed (S202) before manufacturing the semiconductor wafer (S103). Further, the semiconductor test device 100 can be tested in the product debug in the same manner as the conventional one.

FIG. 5 is a functional block diagram showing a second embodiment of a semiconductor test device. As shown in FIG. 5, the analog circuit unit 200 may be connected to a pin of a conventional expensive tester disposed externally. Reference number 300 indicates a wireless unit which performs control by a PC outside the device, and data transmission.

Figure 6:
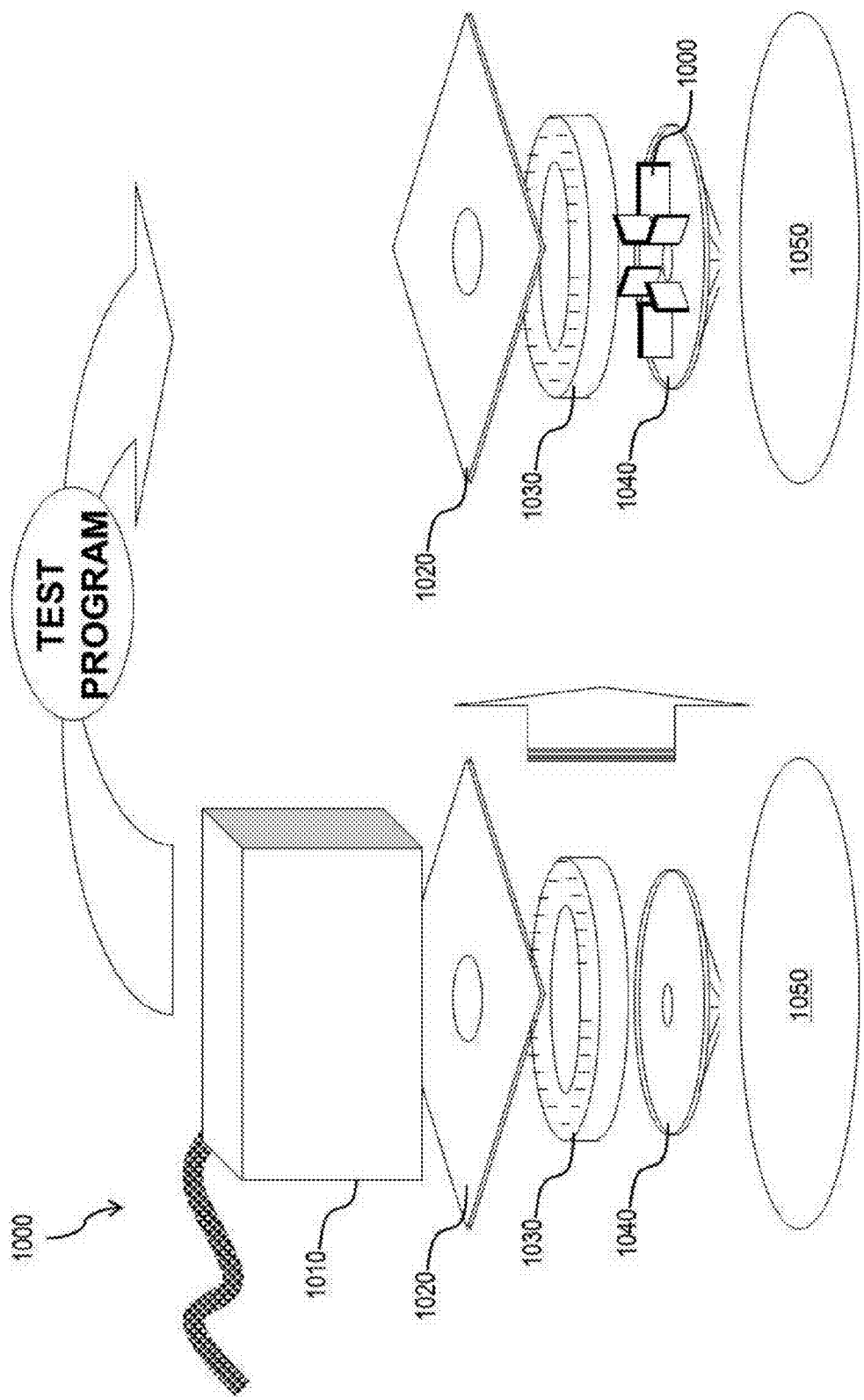
FIG. 6 is a diagram showing an example to which the semiconductor test device of FIG. 5 is applied.

FIG. 6 is a diagram showing one example to which the semiconductor test device of FIG. 5 is applied. The tester 1000 shown in FIG. 6 shows the tester body. A test head 1010 is referred to as a position to which the device of the measurement object is actually attached in the tester. A test board 1020 is referred to as a board which connects the signal of the tester to the device of the measurement object. Necessary components such as a capacitor may be attached to this board. A contact ring 1030 is a mechanism which connects the test board to a probe card. The probe card 1040 is a card which implements a probe needle directly contacting a wafer 1050 being the device of the measurement device. The semiconductor test device 100 may be attached to this portion. First, conventional expensive testers provided outside are used, and advantageous thereof may be utilized respectively, and then are shifted to tests only by a low-cost semiconductor test device 100 after checking its utility. Accordingly, a user can use this method after sufficiently checking the application thereof. Although BOST (built-out self-test) is a device which always exists in between testers, the semiconductor test device 100 can perform a device test without a tester, and thus such usage cannot be done in BOST.

(3) Analog Circuit Unit as Semiconductor Device Capable of Reconfiguration

The analog circuit unit capable of reconfiguration according to one embodiment has a plurality of electric circuit units disposed in arrays. Each electric circuit unit includes an analog digital converter, a digital analog converter and an operational amplifier. Functional blocks of the analog circuit to be the reconfiguration object being divided into a plurality of functional blocks are configured by the analog digital converter, the digital analog converter and the operational amplifier of the electric circuit unit. Further, either one of the plurality of electric circuit units configured in the above manner is connected to another with each other by an analog switch, whereby the analog circuit of the reconfiguration object is configured. Note that the analog circuit unit is not a configuration element, and can be used as a semiconductor device which is single and is capable of reconfiguration.

The analog circuit unit 200 has a plurality of electric circuit units, and can realize the same function as the analog circuit of the reconfiguration object or the analog circuit of the IC to be the DUT. Such function can be realized by Verilog logically, although the description thereof does not exist in analog, and the function description in analog is still an issue. The execution of the virtual tests and de facto of the program description in the problems in the virtual tester technique have been realized. However, verifying technique of test boards including analog still had an issue because the analog simulation (circuit simulation) is slow. There is an emulation technique to electrically verify the simulation so as to speed up the simulation.

Figure 7:
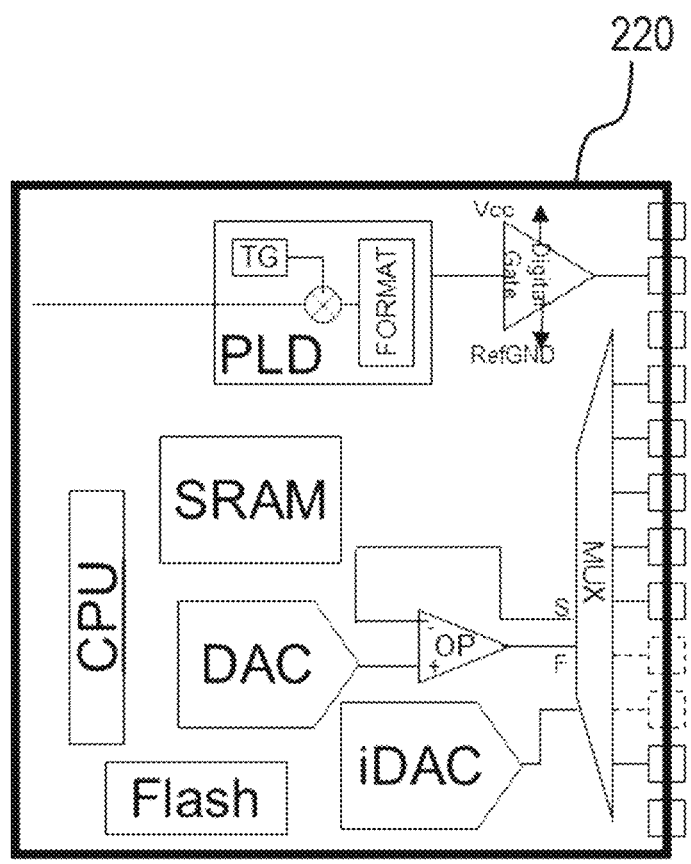
FIG. 7 is a diagram showing one example of an electric circuit unit configuring an analog circuit unit.

FIG. 7 is a diagram showing one example of an electric circuit unit configuring an analog circuit unit. The analog circuit unit (a semiconductor device) 200 is configured by including a plurality of electric circuit units 220 disposed in arrays, each of which having an analog digital converter (DAC: Digital to Analog Converter), a not-shown digital analog converter (ADC: Analog to Digital Converter), a current source DAC (iDAC), and an operational amplifier OP which determines the analog amount.

Further, the electric circuit unit 220 may further include a PLD (Programmable Logic Device) which is capable of configuring a certain amount of logic, and the PLD may control the switch MUX to change the connection to each pin. The electric circuit unit 220 includes a CPU, and SRAM as the program area, and changes the configuration of DAC, ADC, and the operational amplifier OP to change the analog amount. Since these units have function of being connected by an analog switch, these can be configured by the control of CPU. Further, the electric circuit unit may include a flash memory to mount programs thereon. Note that the analog circuit resource of the electric circuit unit 220 is limited. When only one electric circuit unit 220 is used, the resource is limited, and thus the electric circuit unit has a fixed circuit configuration. In order to solve this problem, the electric circuit unit 220 includes an analog switch in between the pin and the resource so that the DAC, ADC, and the operational amplifier OP can be switched to and from each other. The switching of the analog switch can be controlled for example by instruction sets executed by the CPU, whereby the switch signal of the analog switch is output.

Figure 8:
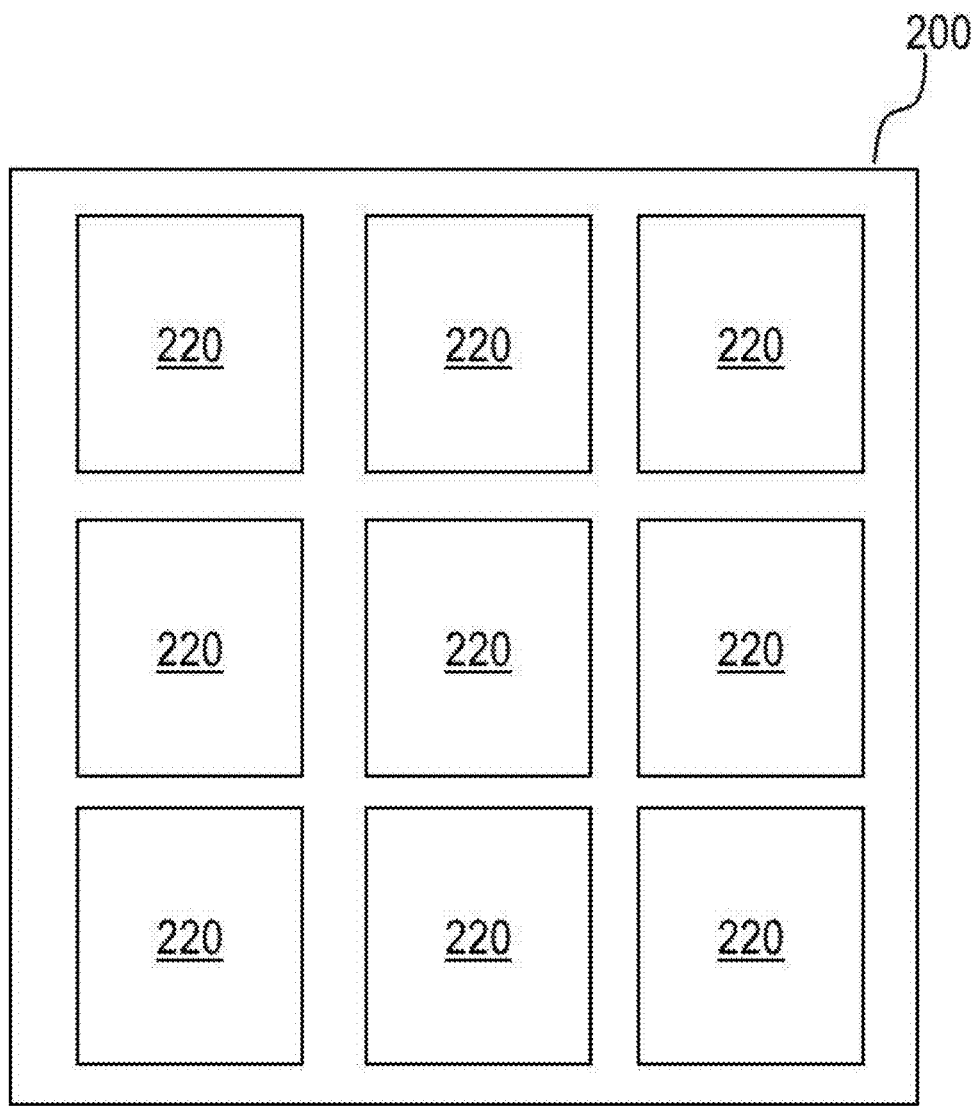
FIG. 8 is a diagram showing one example of the electric circuit units disposed in arrays.

FIG. 8 is a diagram showing one example of the electric circuit units disposed in arrays. As shown in FIG. 8, the analog circuit unit 200 is configured by a plurality of electric circuit units 220 disposed in arrays. Each electric circuit unit 220 limits one circuit scale so as not to be too large, so as to have reconfiguration property. The plurality of electric circuit units are connected to each other by Kelvin connection, whereby the entire plurality of electric circuit units 220 are configured so as to realize a large scale analog circuit.

Although not shown, the analog circuit unit 200 further includes a memory. The truth value data to judge pass/fail results of the emulation verification of the analog circuit, or circuit descriptions of the analog circuit to be the reconfiguration object is stored in the memory. Further, the memory may be the above mentioned MPLD. Each electric circuit unit 220 reads out the circuit description at the time of activation, and switches the connection between the circuits by the analog switch, whereby each electric circuit unit 220 operates so that the circuits in each electric circuit unit is reconfigured in accordance with the circuit description. The programs read out from the flash memory of the electric circuit unit 220 are executed by the CPU, whereby such operation is possible. Further, analog circuit unit 200 configures the analog circuit to be the reconfiguration object, and realizes the emulation function which electrically verifies the function of the analog circuit to be the reconfiguration object.

Note that the MPLD 20 can operate as the logic element which mounts logic from Verilog or C language, whereby the MPLD 20 is capable of mounting logic to perform a function test. On the other hand, the electric circuit unit 220 describes operations by "Spectrre HDL" or "Verilog-A" which is analog function description, and writes the same into the each electric circuit unit 220. The example thereof is described with reference to FIGS. 9A to 9C.

(3.1) RC Circuit Emulation by Analog Circuit

Figure 9A:
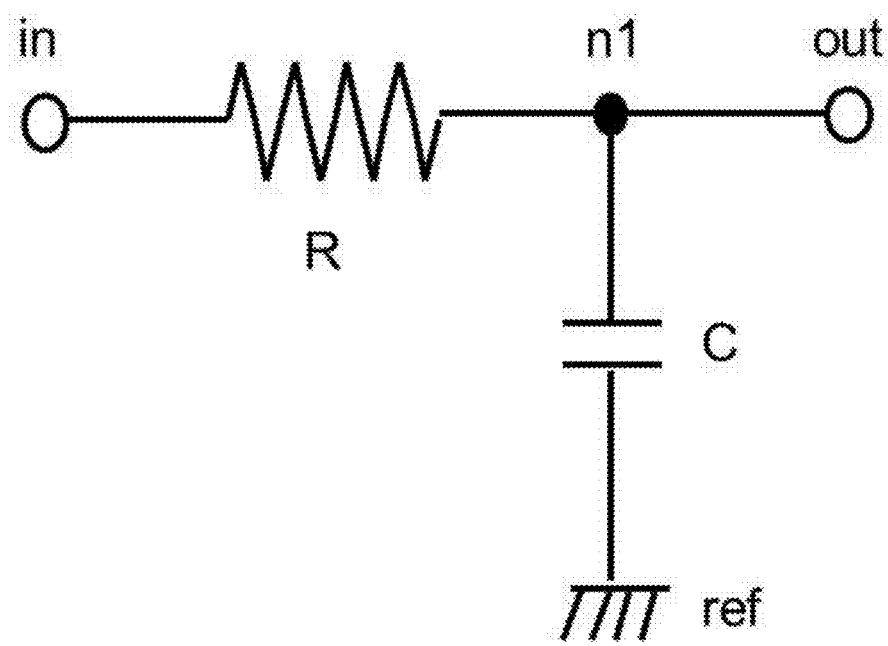
FIG. 9A is a diagram showing an example of an RC circuit.
Figure 9C:
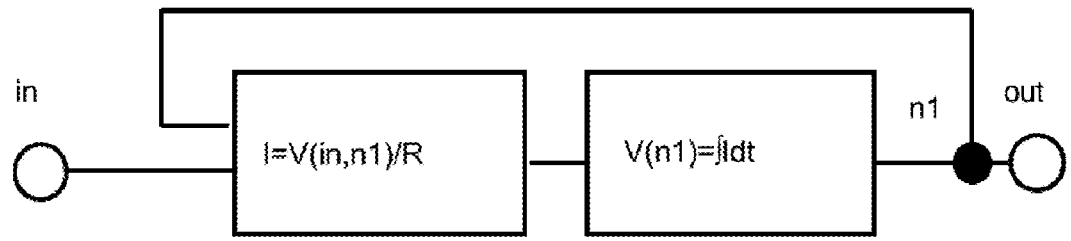
FIG. 9C is a diagram showing an example in which the function description of the RC circuit is divided into functional blocks.

FIG. 9A shows an example of an RC circuit, FIG. 9B is an example of an analog function description of the RC circuit, and FIG. 9C is an example of the function description of the RC circuit being divided into functional blocks of sequential addition circuit so as to be allotted to the electric circuit units. The analog function description of FIG. 9B uses Spectrre HDL, although a similar description content can be achieved by Verilog-A. The resistance is expressed by the value obtained by dividing the applied voltage by the resistance. The capacitor is described by an integral so as to express the charging model.

Figure 9D:
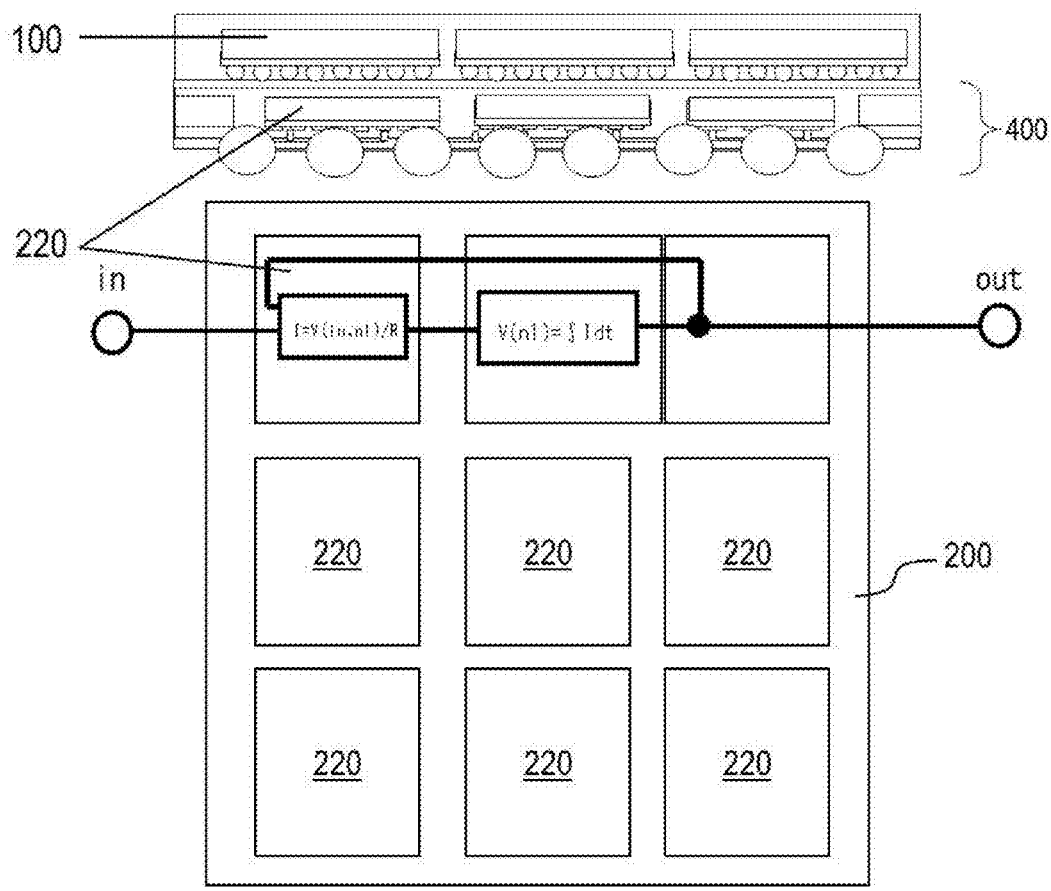
FIG. 9D is a diagram showing an example in which the RC circuit is mounted on an analog circuit unit.

FIG. 9D is a diagram showing an example in which the RC circuit is mounted on an analog circuit unit. The upper portion of FIG. 9D shows the vertical cross-section of the semiconductor test device 100, and the lower portion thereof shows the plan view of the mounting example to the analog circuit. The functional blocks shown in FIG. 9C are capable of being allotted to the electric circuit units.

As described above, the divided functional blocks have a circuit configuration including the analog digital converter, the digital analog converter and the operational amplifier of the electric circuit units, and the plurality of electric circuit units configured in such circuit configuration are connected to each other by Kelvin connection, whereby the analog circuit description configuring the analog circuit unit of the testing device can actually be realized by the electric circuit units. Thus, not a circuit simulation but an electrical simulation can be performed, whereby the verification thereof can be speeded up.

Note that the reference number 400 indicates a groundbreaking component embedded wiring plate "EOMIN (Registered trademark)", in which a copper core developed by the applicant is adopted. "EOMIN (Registered trademark)" is a functional module wiring plate, in which copper is adopted as the core of the component embedded wiring plate, whereby not only advantages of the component embedded wiring plate of small-size and high-density implementation are obtained, but also advantages of high-rigidity, high-reliability, preferable heat dissipation, and noise resistance, can be realized, whereby contributing to small-size/thinness and higher function.

The electric circuit unit 220 is realized by divided plurality of units instead of a large scale electric circuit, and there is a risk of the accuracy being reduced. The analog circuit unit 200 is improved with the accuracy thereof by the plurality of electric circuit units 220 being connected to each other by Kelvin connection, and by the usage of "EOMIN (Registered trademark)", to obtain the above mentioned advantages.

Figure 10A:
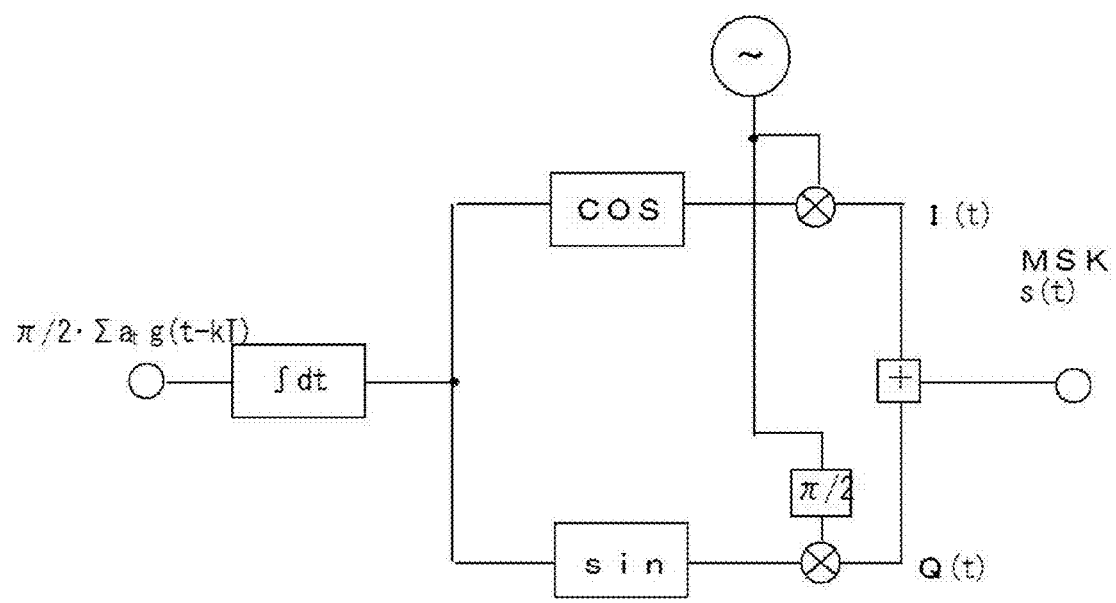
FIG. 10A is a diagram showing an example of a circuit block of MSK model communication system of GSM (Registered trademark) specification.
Figure 10C:
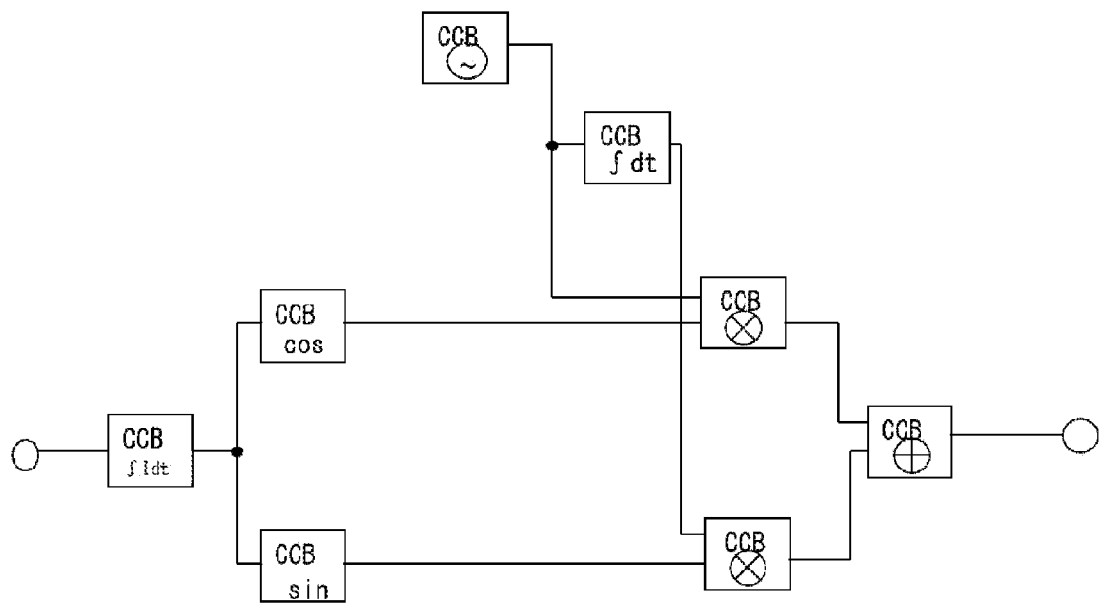
FIG. 10C is a diagram showing an example of the function description of MSK model communication system which is divided into functional blocks so as to be allotted to the electric circuit units.
Figure 10D:
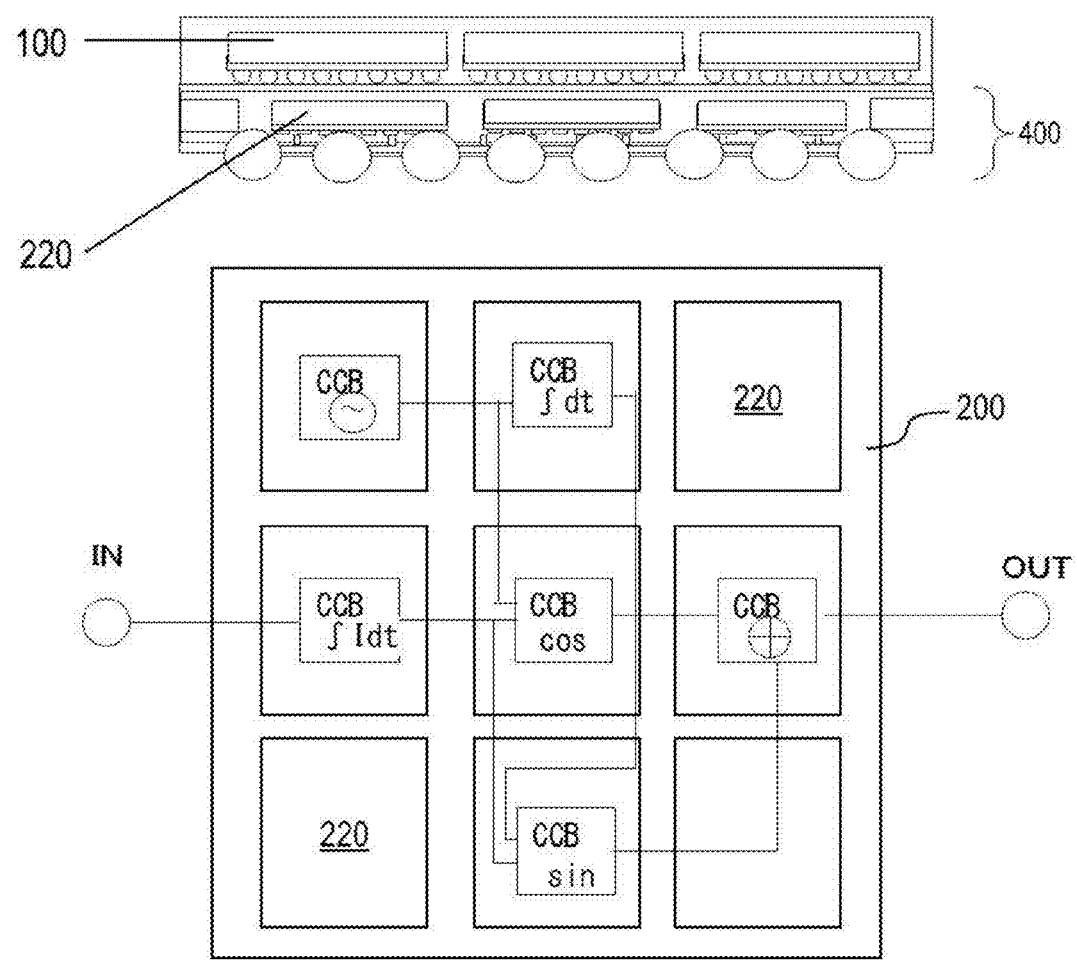
FIG. 10D is a diagram showing an example in which the MSK model communication system is mounted on the analog circuit unit.

(3.2) Emulation of MSK Model Communication System of GSM (Registered Trademark) Specification by Analog Circuit FIG. 10A a diagram showing an example of a circuit block of MSK model communication system of GSM (Registered trademark) specification, FIG. 10B is a diagram showing an example of the analog function description of the circuit block of MSK model communication system of GSM (Registered trademark) specification, FIG. 10C is a diagram showing an example of the function description of MSK model communication system which is divided into functional blocks so as to be allotted to the electric circuit units, and FIG. 10D is a diagram showing an example in which the MSK model communication system is mounted on the analog circuit unit. The upper portion of FIG. 10D shows the vertical cross-section of the semiconductor test device 100, and the lower portion thereof shows the plan view of the mounting example to the analog circuit.

As shown in FIGS. 10B and 10C, the sound is input through an integral circuit and cosine conversion and sine conversion are performed for such value. The source signal (carrier wave) thereof is synthesized by the signal in which the phase is shifted by 90 degrees, I signal and Q signal are generated, to add the signals to perform direct conversion. As a result, MSK signal is generated. FIG. 10D shows a diagram in which such functional blocks are mounted to the electric circuit units 220.

(4) MPLD

The logic of the logic operation of the MPLD 20 may be realized by the truth table data stored in the MLUT 30. Some of the MLUTs 30 operate as a logic element of a combination circuit of AND circuit, an adder, and the like. The other MLUTs operate as a connection element which connects the MLUTs 30 there between realizing the combination circuit. Rewriting of the truth table data to realize the logic element and the connection element is performed by the reconfiguration of the above described memory operation.

A. Logic Element

Figure 11:
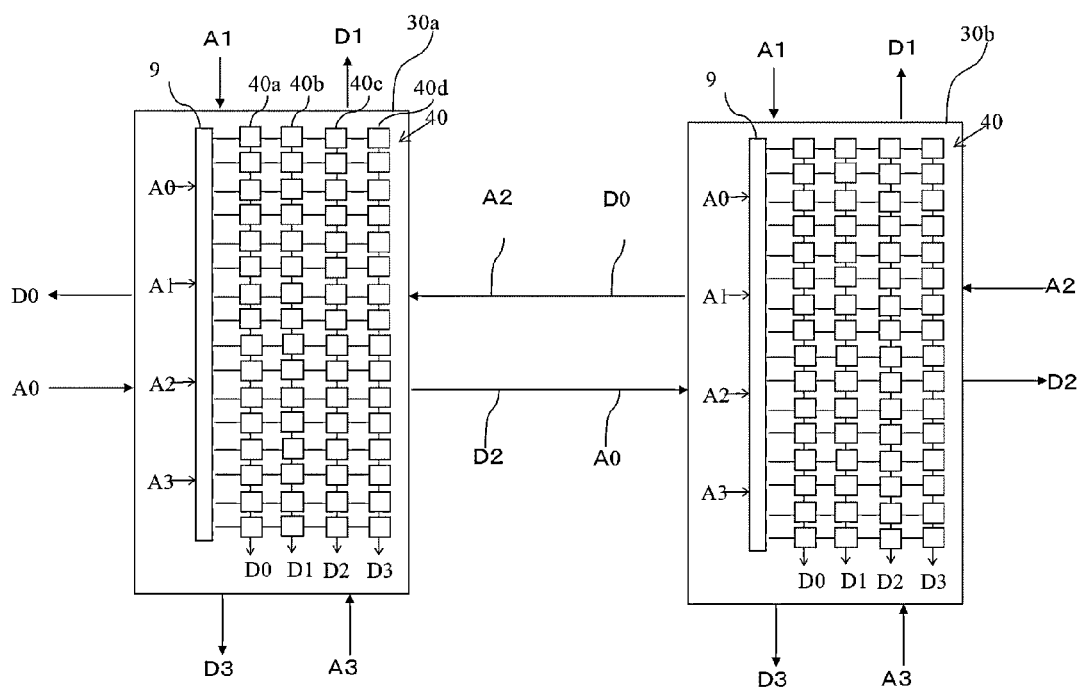
FIG. 11 is a diagram showing one example of an MLUT which operates as a logic element.

FIG. 11 is a view showing one example of the MLUT which operates as a logic element. The MLUT shown in FIG. 11 is similar to MLUT shown in FIG. 10 or semiconductor devices shown in FIG. 1, FIG. 4, or FIG. 7 as a circuit. The address switching circuit 10a and the output data switching circuit 10b are omitted in FIG. 24 for simplifying the explanation. The MLUTs 30a, 30b shown in FIG. 11 have four number of logic operation address lines A0~A3, four number of logic operation data lines D0~D3, 4×16=64 number of storage elements 40, and an address decoder 9 respectively. The logic operation data lines D0~D3 connect serially 24 number of storage elements 40 respectively. The address decoder 9 is configured to select four number of storage elements which are connected to either 24 number of word lines according to signals entered into the logic operation address lines A0~A3. These four storage elements are respectively connected to the logic operation data lines D0~D3 and output data memorized in the storage element to the logic operation data lines D0~D3. For instance, it may be configured to select four storage elements 40a, 40b, 40c, and 40d in case of appropriate signals entered into the logic operation address lines A0~A3. Here, the storage element 40a is connected to the logic operation data line D0. The storage element 40b is connected to the logic operation data line D1. The storage element 40d is connected to the logic operation data line D2. The storage element 40d is connected to the logic operation data line D3. And, the signals which are memorized in the storage elements 40a~40d are outputted to logic operation data lines D0~D3. Therefore, the MLUTs 30a, 30b receive logic operation addresses from the logic operation address lines A0~A3 and output as logic operation data, which are values memorized in the four storage elements 40 selected by the address decoder 9 according to the logic operation addresses, to the logic operation data lines D0~D3 respectively. Note that the logic operation address line A2 of the MLUT 30a is connected to the logic operation data line D0 of adjacent the MLUT 30b. The MLUT 30a receives data as the logic operation address output from the MLUT 30b.

And, the logic operation data line D2 of the MLUT 30a is connected to the logic operation address line A0 of the MLUT 30b. The MLUT 30b receives data as the logic operation address output from the MLUT 30a. For instance, the logic operation data line D2 of the MLUT 30a outputs a signal, which is memorized in any one of 24 number of storage elements connected to the logic operation data line D2, to the logic operation address A0 of the MLUT 30b in accordance with signals entering into the logic operation address lines A0~A3 of MLUT 30a. Similarly, the logic operation data line D0 of the MLUT 30b outputs a signal, which is memorized in any one of 24 number of storage elements connected to the logic operation data line D0, to the logic operation address A2 of the MLUT 30a in accordance with signals entering into the logic operation address lines A0~A3 of the MLUT 30b. In this manner, one pair of the address line and the data line is used for connecting the MPLDs with each other.

Note that the number of AD pairs included in the MLUTs 30a, 30b shown in FIG. 11 is four. However, the number of the AD pairs is not limited to four, as described later.

Figure 12:
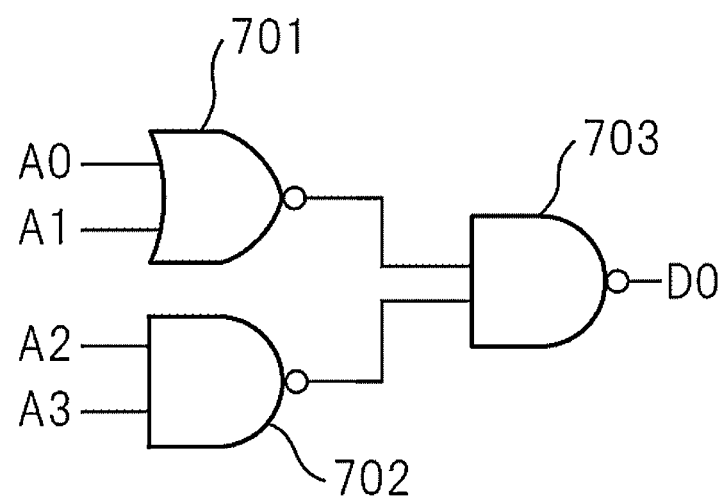
FIG. 12 is a diagram showing one example of an MLUT which operates as a logic circuit.

FIG. 12 is a view showing one example of the MLUT which operates as a logic circuit. In this example, the logic circuit is configured in the following manner. That is, the logic operation address lines A0 and A1 are inputs of a 2-input NOR circuit 701, and the logic operation address lines A2 and A3 are inputs of a 2-input NAND circuit 702. Further, an output of the 2-input NOR circuit 701 and an output of the 2-input NAND circuit 702 are inputted to a 2-input NAND circuit 703, and an output of the 2-input NAND circuit 703 is outputted to the logic operation data line D0.

FIG. 13 is a view showing a truth table of the logic circuit of FIG. 12. Since the logic circuit of FIG. 12 has four inputs, all inputs from the inputs A0-A3 are used as inputs. On the other hand, since the logic circuit only has one output, only the output D0 is used as an output. In each field for the outputs D1-D3 in the truth table, "*" is described. This means that the value may take either "0" or "1". However, when actually writing in the truth table data into the MLUT for reconfiguration, either one value of "0" or "1" needs to be written into these fields.

B. Connection Element

Figure 14:
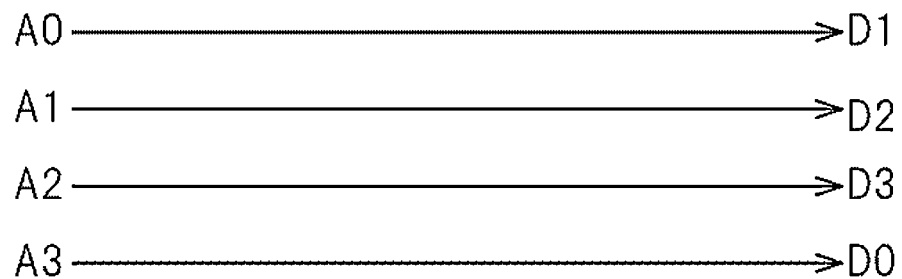
FIG. 14 is a diagram showing one example of an MLUT which operates as a connection element.

FIG. 14 is a view showing one example of the MLUT which operates as a connection element. In FIG. 14, the MLUT as the connection element operates to output a signal of the logic operation address line A0 to the logic operation data line D1, output a signal of the logic operation address line A1 to the logic operation data line D2, and output a signal of the logic operation address line A2 to the logic operation data line D3. The MLUT as the connection element further operates to output a signal of the logic operation address line A3 to the data line D1.

FIG. 15 is a view showing a truth table of the connection element of FIG. 14. The connection element shown in FIG. 14 has four inputs and four outputs. Accordingly, all inputs from the inputs A0-A3 and all outputs to the outputs D0-D3 are used. The MLUT operates as a connection element which outputs the signal of the input A0 to the output D1, outputs the signal of the input A1 to the output D2, outputs the signal of the input A2 to the output D3, and outputs the signal of the input A3 to the output D0, in accordance with the truth table shown in FIG. 15.

Figure 16:
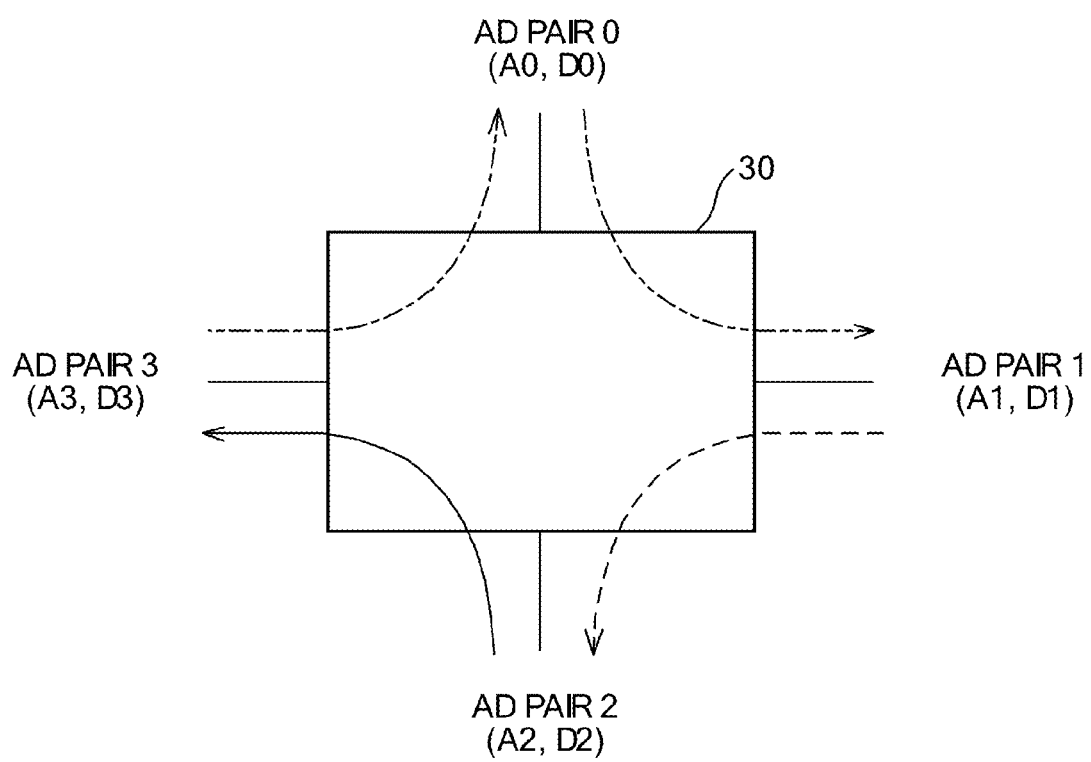
FIG. 16 is a diagram showing one example of a connection element which is realized by an MLUT having four AD pairs.

FIG. 16 is a view showing one example of the connection element realized by the MLUT including four AD pairs. AD0 comprises the logic operation address line A0 and the logic operation data line D0. AD1 comprises the logic operation address line A1 and the logic operation data line D1. AD2 comprises the logic operation address line A2 and the logic operation data line D2. And, AD3 comprises the logic operation address line A3 and the logic operation data line D3. A chain line illustrated in FIG. 16, shows signal flow that a signal, which is entered into the logic operation address line A0 of the AD pair 0, is output to the logic operation data line D1 of the AD pair 1. A two-dot chain line illustrated in FIG. 16, shows signal flow that a signal, which is entered into the logic operation address line A1 of the second AD pair 1, is output to the logic operation data line D2 of the AD pair 2. A dash line shows signal flow that a signal, which is entered into the logic operation address line A2 of the AD pair 2, is output to the logic operation data line D3 of the AD pair 3. A solid line shows signal flow that a signal, which is entered into the logic operation address line A3 of the AD pair 3, is output to the logic operation data line D0 of the AD pair 0.

Note that although the MLUT 30 comprises the four number of the AD pairs shown in FIG. 16, the number of the AD pairs is not especially limited the number of four.

C. Combination Function of Logic Element and Connection Element

Figure 17:
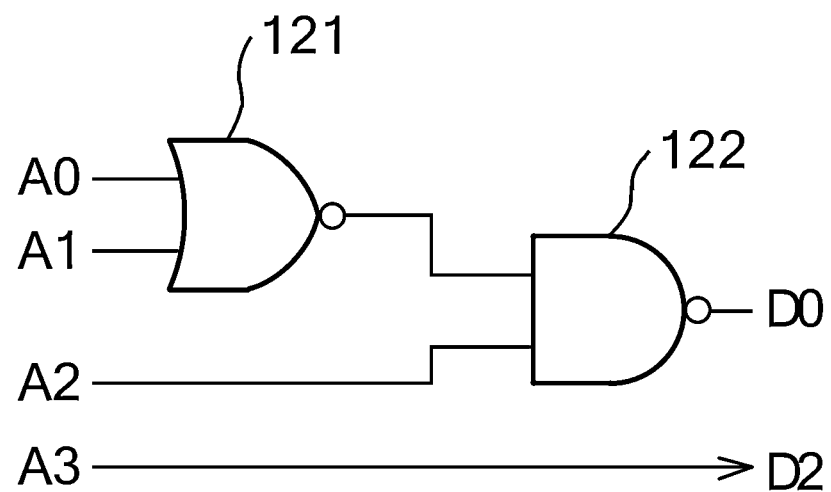
FIG. 17 is a diagram showing one example in which one MLUT operates as the logic element and the connection element.

FIG. 17 is a view showing one example of a single MLUT which operates as the logic element and the connection element. In the example shown in FIG. 17, the logic circuit is configured in the following manner. That is, the logic operation address lines A0 and A1 are inputs of a 2-input NOR circuit 121, an output of the 2-input NOR circuit 121 and the logic operation address line A2 are inputs of a 2-input NAND circuit 122, and an output of the 2-input NAND circuit 122 is outputted to the data line D0. Further, at the same time, a connection element which outputs the signal of the logic operation address line A3 to the logic operation data line D2 is configured.

FIG. 18 is a view showing a truth table of the logic element and the connection element of FIG. 17. The logic operation of FIG. 17 uses inputs D0~D3 as three inputs, and one output D0 as an output. On the other hand, the connection element of FIG. 18 configures a connection element which outputs the signal of the input A3 to the output D2.

Figure 19:
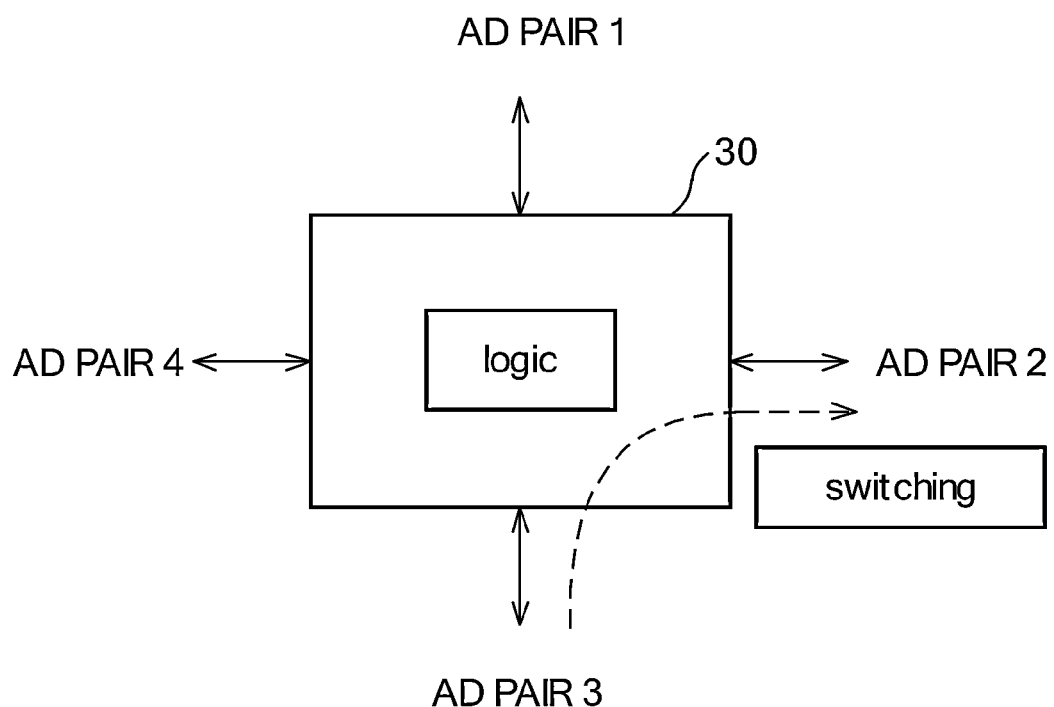
FIG. 19 is a diagram showing one example of the logic operation and the connection element realized by MLUT which has AD pairs.

FIG. 19 is a view showing one example of the logic operation and the connection element realized by the MLUT including the AD pairs. Along with the MLUT shown in FIG. 16, AD0 comprises the logic operation address line A0 and the logic operation data line D0. AD1 comprises the logic operation address line A1 and the logic operation data line D1. AD2 comprises the logic operation address line A2 and the logic operation data line D2. And, AD3 comprises the logic operation address line A3 and the logic operation data line D3. As described above, the MLUT 30 realizes two operations of the logic operation (three inputs and one output) and the connection element (one input and one output) by a single MLUT 30. Concretely, the logic operation uses the logic operation address line A0 of the AD pair 0, the logic operation address line A1 of the AD pair 1, and the logic operation address line A2 of the AD pair 2 as the inputs. And, the address line of the logic operation data line D0 of the AD pair 0 is used as the output. Also, the connection element outputs the signal inputted to the logic operation address line A3 of the AD pair 3 to the logic operation data line D2 of the AD pair 2 as shown in a dashed line.

Although the embodiments of the present invention have been described in detail, it should be understood that the various changes, substitutions, and alterations could be made hereto without departing from the spirit and scope of the invention.

DESCRIPTION OF SYMBOLS

20 MPLD
30 MLUT
40a, 40b memory cell unit
100 semiconductor device
200 analog circuit unit

What is claimed is:

1. A semiconductor device capable of reconfiguration, comprising a plurality of electric circuit units disposed in an array, each of the electric circuit units comprising an analog digital converter, a digital analog converter, and an analog switch, and an operational amplifier,
- wherein a plurality of functional blocks obtained by dividing an analog circuit, which is a target of reconfiguration, are configured by at least some of the plurality of electric circuit units, respectively, by configuring the analog digital converter, the digital analog converter and the operational amplifier of the electric circuit units in each of said some of the plurality of electric circuit units, and
- wherein said some of the plurality of electric circuit units that are configured to correspond to the plurality of functional blocks, respectively, are connected to each other by the analog switch included in each of said some of the plurality of electric circuit units such that the analog circuit, which is the target of reconfiguration is realized by said some of the plurality of electric circuit units that connected to each other,
- wherein the semiconductor device further comprises:
  - a logic unit, the logic unit including a plurality of memory cell units which configure an array and are connected to each other, and the memory cell units operate as a logic element when truth value table data is written in, which is configured so that a logic calculation of an input value specified by a plurality of addresses is output to a data line, and/or operate as a connection element when truth value table data is written in, which is configured so that an input value specified by a certain address is output to a data line to be connected to an address of another memory cell unit; and
  - for each memory cell unit, an address decoder which decodes an address input from N (N being an integer of 2 or more) number of address lines, and outputs a word selection signal to a word line;
  - wherein each memory cell unit is connected to the word line and the data line, stores data configuring the truth value table, and has a plurality of storage elements which input and output the data to the data line by the word selection signal input from the word line, and
  - wherein the respective N number of address lines of the memory cell units are connected to the data line of the other N number of memory cell units.

2. The semiconductor device according to claim 1, wherein the plurality of electric circuit units are connected to each other via a wiring plate disposed in a lower portion.

3. The semiconductor device according to claim 1, further including a memory.

4. The semiconductor device according to claim 3, wherein the memory stores a circuit description of the analog circuit of the reconfiguration object, and
- wherein each of the electric circuit units reads out the circuit description at a time of activation, and operates so as to reconfigure a circuit in each of the electric circuit units by the analog switch.

5. The semiconductor device according to claim 1, which configures the analog circuit of the reconfiguration object and electrically verifies a function of the analog circuit of the reconfiguration object.

6. The semiconductor device according to claim 5,
- wherein each of the memory cell units includes a pair of a first and a second memory cell units, each of the first and the second memory cell units operating as a logic element when truth value table data is written in, which is configured so that a logic calculation of an input value specified by a plurality of addresses is output to a data line, and/or operates as a connection element when truth value table data is written in, which is configured so that an input value specified by a certain address is output to a data line to be connected to an address of another memory cell unit,
- wherein a latter stage of the first memory cell unit includes a sequential circuit which synchronizes with a clock, and
- wherein the logic unit includes, for each pair of the first and the second memory cell units, a selection unit which selectively outputs an address to the first or the second memory cell unit in accordance with an operation switch signal.

7. The semiconductor device according to claim 6, further comprising an analog circuit unit having an electric circuit in accordance with the test device, and
- wherein the second memory cell unit is capable of reconfiguring a logic circuit identical to a logic circuit of the test device in accordance with the truth value table data defining the logic circuit of the test device, and judges whether an expected value of an output of the test device stored in the first memory cell unit is consistent with an output of the test device.

8. The semiconductor device according to claim 1,
- wherein the logic unit stores an expected value of an output of a test device in the memory cell units, and
- wherein the logic unit is capable of configuring a logic circuit identical to a logic circuit of the test device, and operates as the logic element, whereby judges whether the expected value is consistent with the output of the test device.

* * * * *